(12) United States Patent
Tak et al.

(10) Patent No.: US 9,859,393 B2
(45) Date of Patent: Jan. 2, 2018

(54) INTEGRATED CIRCUIT DEVICE AND METHOD OF FABRICATING THE SAME

(71) Applicant: Samsung Electronics Co., Ltd., Suwon-si (KR)

(72) Inventors: Yong-suk Tak, Seoul (KR); Tae-jong Lee, Hwaseong-si (KR); Hyun-seung Kim, Bucheon-si (KR); Bon-young Koo, Suwon-si (KR); Ki-yeon Park, Hwaseong-si (KR); Gi-gwan Park, Hwaseong-si (KR); Mi-seon Park, Daegu (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/401,659

(22) Filed: Jan. 9, 2017

(65) Prior Publication Data

US 2017/0222014 A1    Aug. 3, 2017

(30) Foreign Application Priority Data

Feb. 1, 2016  (KR) .......................... 10-2016-0012452

(51) Int. Cl.
*H01L 29/76* (2006.01)
*H01L 29/49* (2006.01)
(Continued)

(52) U.S. Cl.
CPC .... *H01L 29/4983* (2013.01); *H01L 21/76805* (2013.01); *H01L 21/76843* (2013.01); *H01L 21/76895* (2013.01); *H01L 23/535* (2013.01); *H01L 23/5329* (2013.01); *H01L 21/823475* (2013.01); *H01L 29/7855* (2013.01); *H01L 29/7856* (2013.01)

(58) Field of Classification Search
CPC ....... H01L 21/31633; H01L 21/823475; H01L 23/5329; H01L 29/7855; H01L 29/7856
USPC .......................................................... 257/213
See application file for complete search history.

(56) References Cited

U.S. PATENT DOCUMENTS 8,586,487 B2    11/2013  Nguyen et al.
8,962,454 B2    2/2015   Takaba
(Continued)

FOREIGN PATENT DOCUMENTS

JP    08-153786    6/1996
JP    2011-171623  9/2011
KR    10-0772703   11/2007

*Primary Examiner* — David Vu
*Assistant Examiner* — Brandon Fox
(74) *Attorney, Agent, or Firm* — Muir Patent Law, PLLC

(57) ABSTRACT

A device includes: a gate line on an active region of a substrate, a pair of source/drain regions in the active region on both sides of the gate line, a contact plug on at least one source/drain region out of the pair of source/drain regions; and a multilayer-structured insulating spacer between the gate line and the contact plug. The multilayer-structured insulating spacer may include an oxide layer, a first carbon-containing insulating layer covering a first surface of the oxide layer adjacent to the gate line, and a second carbon-containing insulating layer covering a second surface of the oxide layer, opposite to the first surface of the oxide layer, adjacent to the contact plug.

20 Claims, 41 Drawing Sheets

(51) Int. Cl.
*H01L 23/535* (2006.01)
*H01L 21/768* (2006.01)
*H01L 23/532* (2006.01)
H01L 29/78 (2006.01)
H01L 21/8234 (2006.01)

(56) References Cited

U.S. PATENT DOCUMENTS

| | | |
|---|---|---|
| 9,040,411 B2 | 5/2015 | Grill et al. |
| 9,117,664 B2 | 8/2015 | Zhou |
| 9,184,046 B2 | 11/2015 | Takeda et al. |
| 9,196,542 B2 | 11/2015 | Wang et al. |
| 2009/0191706 A1 | 7/2009 | Kubota |
| 2015/0118865 A1 | 4/2015 | Shimizu |
| 2015/0243544 A1* | 8/2015 | Alptekin ............ H01L 21/7682 438/586 |
| 2015/0249036 A1 | 9/2015 | Cai et al. |
| 2015/0262876 A1 | 9/2015 | Yang et al. |
| 2016/0141381 A1* | 5/2016 | Kim ................ H01L 29/66545 257/288 |
| 2016/0372567 A1* | 12/2016 | Tak ..................... H01L 29/6656 |

\* cited by examiner

B – B'

C – C'

B – B'

B - B'

B – B'

B – B'

C - C'

C – C'

B – B'

C – C'

B – B'

B - B'

B – B'

B - B'

B - B'

B - B'

C - C'

INTEGRATED CIRCUIT DEVICE AND METHOD OF FABRICATING THE SAME

CROSS-REFERENCE TO RELATED APPLICATION

This application claims the benefit of priority under 35 U.S.C. §119 to Korean Patent Application No. 10-2016-0012452, filed on Feb. 1, 2016, in the Korean Intellectual Property Office, the disclosure of which is incorporated herein in its entirety by reference.

BACKGROUND

The present disclosure relates to an integrated circuit device and a method of fabricating the same, and more particularly, to an integrated circuit device including a field effect transistor and to a method of fabricating the same.

In the rapidly developing electronics industry, demand for a high speed, high reliability and a multi-functional ability has been increasing for semiconductor devices. In order to meet this demand, the structure of semiconductor devices has been getting more complex and the size of the semiconductor devices has been highly miniaturized. Recently, since semiconductor devices require fast operation speeds and operation accuracy as well, various studies for optimizing structures of transistors included in the semiconductor devices are being carried out. In particular, as a gate length is increasingly reduced, etch resistance of layers for electrically insulating a gate line has an increasing influence on leakage current properties.

SUMMARY

The inventive concept provides an integrated circuit device having a structure capable of realizing optimal reliability and performance in a highly down-scaled transistor by providing required etch resistance during a fabrication process of an integrated circuit device.

The inventive concept also provides a method of fabricating an integrated circuit device capable of realizing optimal reliability and performance in a highly down-scaled transistor by providing required etch resistance during a fabrication process of the integrated circuit device.

According to an aspect of the inventive concept, there is provided a device including: a gate line on an active region of a substrate; a pair of source/drain regions in the active region on both sides of the gate line; a contact plug on at least one source/drain region out of the pair of source/drain regions; and a multilayer-structured insulating spacer between the gate line and the contact plug, wherein the multilayer-structured insulating spacer comprises: an oxide layer; a first carbon-containing insulating layer covering a first surface of the oxide layer adjacent to the gate line; and a second carbon-containing insulating layer covering a second surface of the oxide layer, opposite to the first surface of the oxide layer, adjacent to the contact plug, and wherein the first carbon-containing insulating layer and the second carbon-containing insulating layer have different carbon contents.

According to a further aspect of the inventive concept, there is provided a device including: a gate insulating spacer on a substrate, the gate insulating spacer including a first carbon-containing insulating layer; a gate line in a space defined by the gate insulating spacer; an oxide layer covering a sidewall of the gate line, with the gate insulating spacer being interposed between the oxide layer and the gate line; a contact hole on one side of the gate line, the contact hole penetrating the oxide layer and exposing an active region of the substrate; a contact insulating spacer in the contact hole, the contact insulating spacer including a second carbon-containing insulating layer having different carbon content from that of the first carbon-containing insulating layer; and a contact plug in the contact hole, the contact plug being surrounded by the contact insulating spacer.

According to a further aspect of the inventive concept, there is provided a device including: a gate line on an active region of a substrate; a pair of source/drain regions in the active region on both sides of the gate line; a contact plug on at least one source/drain region out of the pair of source/drain regions; an oxide layer between the gate line and the contact plug; a first carbon-containing insulating layer covering a first sidewall of the oxide layer adjacent to the gate line; and a second carbon-containing insulating layer covering a second sidewall of the oxide layer, opposite to the first sidewall of the oxide layer, adjacent to the contact plug, wherein the first carbon-containing insulating layer and the second carbon-containing insulating layer have different carbon contents.

The integrated circuit device fabricated according to the inventive concept includes the multilayer-structured insulating spacer between the gate line and the contact plug. The multilayer-structured insulating spacer has a carbon content optimized to provide etch resistance sufficient to prevent an electrical short circuit between the gate line and the contact plug. Therefore, the multilayer-structured insulating spacer between the gate line and the contact plug can provide a sufficiently low dielectric constant and can prevent the occurrence of leakage currents between the gate line and the contact plug.

BRIEF DESCRIPTION OF THE DRAWINGS

Embodiments of the inventive concept will be more clearly understood from the following detailed description taken in conjunction with the accompanying drawings in which:

FIG. 1A is a layout diagram of the integrated circuit device, FIG. 1B is a cross-sectional view of the integrated circuit device taken along a line B-B' of FIG. 1A, and FIG. 1C is a cross-sectional view of the integrated circuit device taken along a line C-C' of FIG. 1A;

FIG. 3A is a cross-sectional view of the integrated circuit device, which corresponds to the cross-section taken along the line B-B' of FIG. 1A, and FIG. 3B is an enlarged view showing some components of the integrated circuit device included in a dashed-line area marked by 3B in FIG. 3A;

FIG. 4A is a cross-sectional view of the integrated circuit device, which corresponds to the cross-section taken along the line B-B' of FIG. 1A, and FIG. 4B is a cross-sectional view of the integrated circuit device, which corresponds to the cross-section taken along the line C-C' of FIG. 1A;

FIG. 6A is a cross-sectional view of the integrated circuit device, which corresponds to the cross-section taken along the line B-B' of FIG. 1A, and FIG. 6B is a cross-sectional view of the integrated circuit device, which corresponds to the cross-section taken along the line C-C' of FIG. 1A;

FIG. 7A is a cross-sectional view of the integrated circuit device, which corresponds to the cross-section taken along the line B-B' of FIG. 1A, and FIG. 7B is a cross-sectional view of the integrated circuit device, which corresponds to the cross-section taken along the line C-C' of FIG. 1A;

FIG. 9A is a layout diagram of the integrated circuit device, and FIG. 9B is a cross-sectional view of the integrated circuit device taken along a line C-C' of FIG. 9A;

DETAILED DESCRIPTION OF THE EMBODIMENTS

Figure 1A:
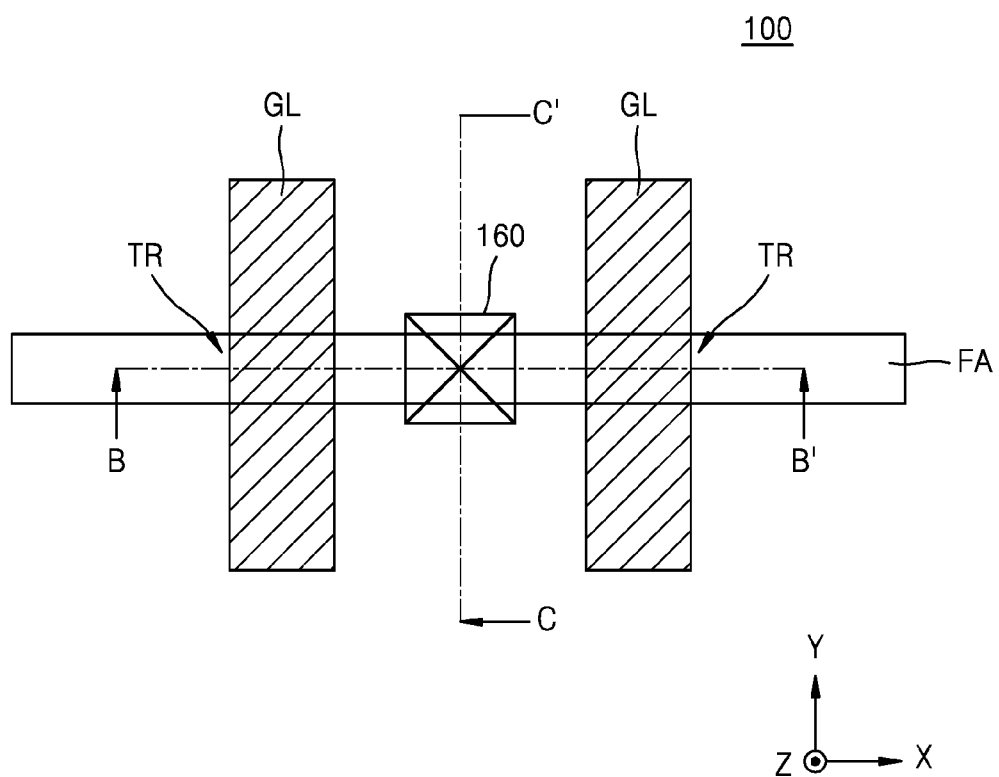
FIGS. 1A to 1C are diagrams for explaining an integrated circuit device according to exemplary embodiments.

The present disclosure now will be described more fully hereinafter with reference to the accompanying drawings, in which various embodiments are shown. The invention may, however, be embodied in many different forms and should not be construed as limited to the example embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, the size and relative sizes of layers and regions may be exaggerated for clarity. Like numbers refer to like elements throughout. Though the different figures show variations of exemplary embodiments, these figures are not necessarily intended to be mutually exclusive from each other. Rather, as will be seen from the context of the detailed description below, certain features depicted and described in different figures can be combined with other features from other figures to result in various embodiments, when taking the figures and their description as a whole into consideration.

Although the figures described herein may be referred to using language such as "one embodiment," or "certain embodiments," these figures, and their corresponding descriptions are not intended to be mutually exclusive from other figures or descriptions, unless the context so indicates. Therefore, certain aspects from certain figures may be the same as certain features in other figures, and/or certain figures may be different representations or different portions of a particular exemplary embodiment.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

Embodiments described herein will be described referring to plan views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures may have schematic properties, and shapes of regions shown in figures may exemplify specific shapes of regions of elements to which aspects of the invention are not limited.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Also these spatially relative terms such as "above" and "below" as used herein have their ordinary broad meanings—for example element A can be above element B even if when looking down on the two elements there is no overlap between them (just as something in the sky is generally above something on the ground, even if it is not directly above).

Contact plug may be, for example, conductive plugs formed of a conductive material such as a metal. The wiring patterns described above may also be formed of a conductive material, for example, a metal, and each may be formed horizontally within the die.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present. Other words used to describe the relationship between elements should be interpreted in a like fashion (e.g., "between" versus "directly between," "adjacent" versus "directly adjacent," etc.).

Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

As used herein, the term "silicon oxide layer" may refer to a $SiO_2$ layer, unless otherwise defined. As used herein, the term "silicon nitride layer" may refer to a $Si_3N_4$ layer, unless otherwise defined. As used herein, the term "width" may refer to a size along a length direction (X direction) of a fin-type active region FA, unless otherwise defined.

Figure 1B:
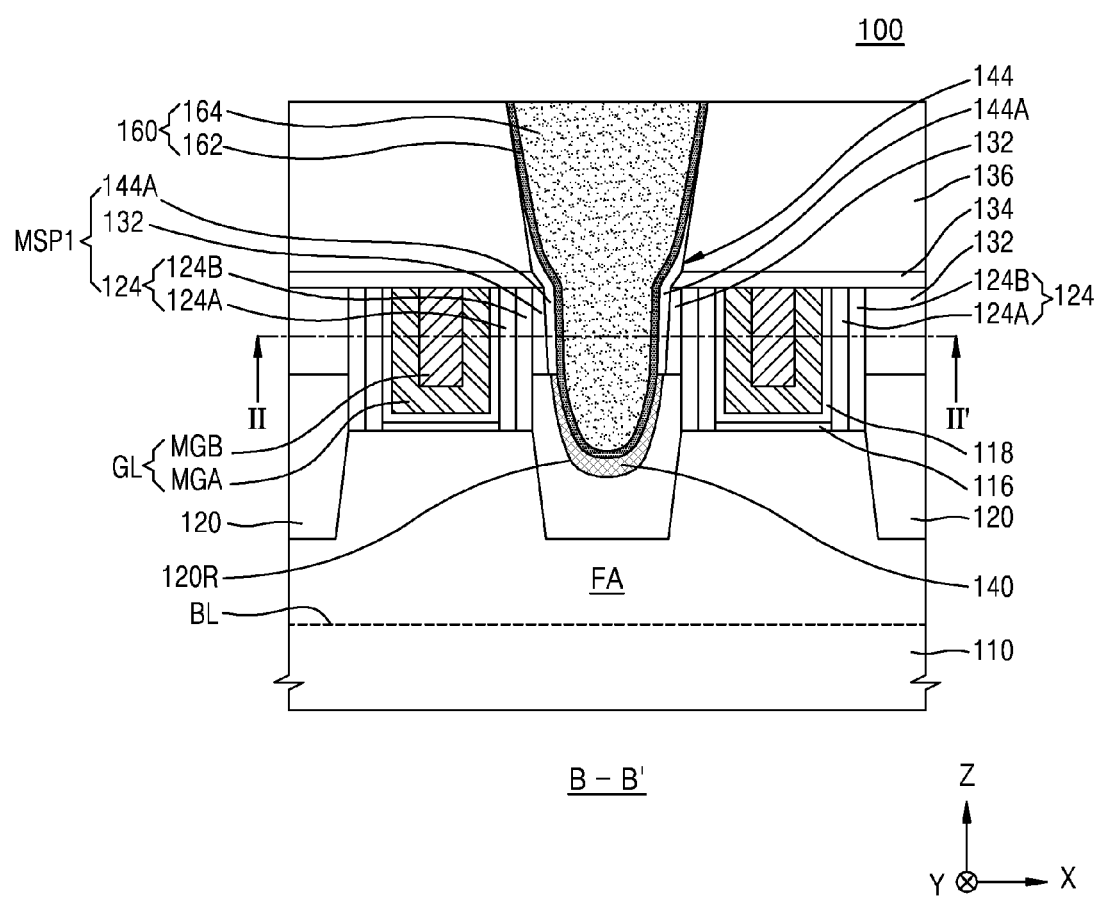
Figure 1C:
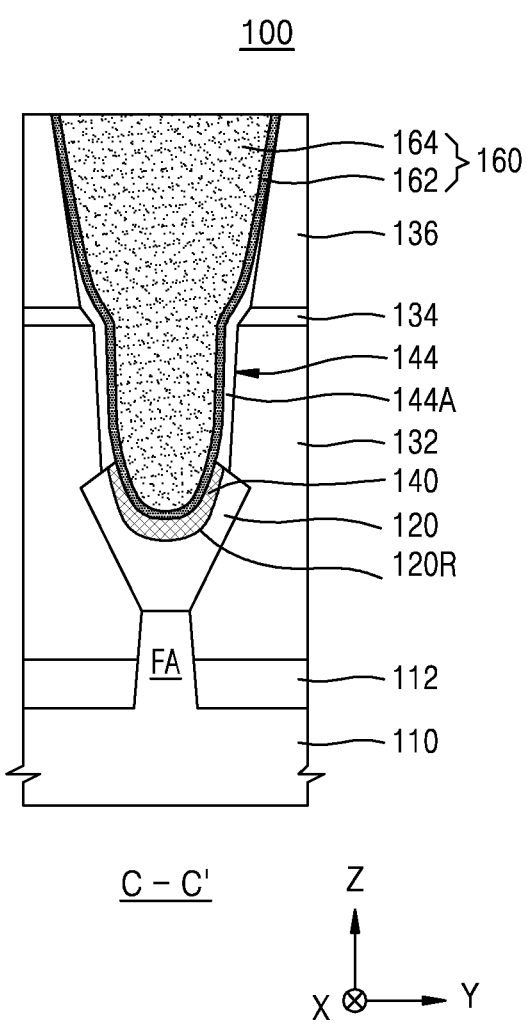

FIGS. 1A to 1C are diagrams for explaining an integrated circuit device according to exemplary embodiments, FIG. 1A is a layout diagram of an integrated circuit device 100 according to exemplary embodiments, FIG. 1B is a cross-sectional view of the integrated circuit device 100 taken along a line B-B' of FIG. 1A, and FIG. 1C is a cross-sectional view of the integrated circuit device 100 taken along a line C-C' of FIG. 1A.

Referring to FIGS. 1A to 1C, the integrated circuit device 100 includes a substrate 110 having a fin-type active region FA extending in a first direction (X direction). In FIG. 1B, a level of a bottom surface (e.g., a bottom border or boundary) of the fin-type active region FA is marked by a dashed line BL.

The substrate 110 may include a semiconductor such as Si or Ge, or a compound semiconductor such as SiGe, SiC, GaAs, InAs, or InP. In some embodiments, the substrate 110 may include at least one of a Group III-V material and a Group IV material. The Group III-V material may be a binary, ternary, or quaternary compound including at least one Group III element and at least one Group V element. The Group III-V material may be a compound including at least one element of In, Ga, and Al as a Group III element and including at least one element of As, P, and Sb as a Group V element. For example, the Group III-V material may be selected from among InP, $In_zGa_{1-z}As$ (0≤z≤1), and $Al_zGa_{1-z}As$ (0≤z≤1). The binary compound may be, for example, one of InP, GaAs, InAs, InSb, and GaSb. The ternary compound may be, for example, one of InGaP, InGaAs, AlInAs, InGaSb, GaAsSb, and GaAsP. The Group IV material may be Si or Ge. However, the Group III-V material and the Group IV material, which can be used for the integrated circuit device according to the inventive concept, are not limited to the examples set forth above. The Group III-V material and the Group IV material such as Ge may be used as a channel material with which a low-power high-speed transistor is made. A high-performance CMOS may be formed by using a semiconductor substrate including a Group III-V material, for example, GaAs, which has a higher electron mobility than Si, and using a semiconductor substrate including a semiconductor material, for example, Ge, which has a higher hole mobility than Si. In some embodiments, when an NMOS transistor is formed on the substrate 110, the substrate 110 may include one of the exemplary Group III-V materials set forth above. In some other embodiments, when a PMOS transistor is formed on the substrate 110, at least a portion of the substrate 110 may include Ge. In another example, the substrate 110 may have a silicon-on-insulator (SOI) structure. The substrate 110 may include a conductive region, for example, an impurity-doped well, or an impurity-doped structure.

A lower sidewall of the fin-type active region FA on the substrate 110 is covered with a device isolation layer 112, and the fin-type active region FA protrudes in a fin shape upwards from the device isolation layer 112 along a third direction (Z direction) perpendicular to a main plane (X-Y plane) of the substrate 110.

A plurality of interface layers 116, a plurality of gate insulating layers 118, and a plurality of gate lines GL extend, on the fin-type active region FA on the substrate 110, in a second direction (Y direction) intersecting with a first direction (X direction).

The plurality of gate insulating layers 118 and the plurality of gate lines GL may extend while covering a top surface and both sidewalls of each fin-type active region FA and covering a top surface of the device isolation layer 112. A plurality of transistors TR may be formed at points at which the fin-type active region FA intersects with the plurality of gate lines GL. Each of the plurality of transistors TR may include a 3-dimensional-structured metal oxide semiconductor (MOS) transistor in which a channel is formed on the top surface and both sidewalls of the fin-type active region FA.

Both sidewalls of each of the plurality of interface layers 116, the plurality of gate insulating layers 118, and the plurality of gate lines GL are covered with a gate insulating spacer 124. In some embodiments, the gate insulating spacer 124 may include a first carbon-containing insulating layer 124A and a silicon nitride layer 124B on the first carbon-containing insulating layer 124A, the first carbon-containing insulating layer 124A contacting a gate insulating layer 118 on a sidewall of each gate line GL, and the silicon nitride layer 124B covering the sidewall of each gate line GL. As used herein, the term "silicon nitride layer" may refer to a $Si_3N_4$ layer.

Although the gate insulating spacer 124 is shown in FIG. 1B as having a double-layer structure including the first carbon-containing insulating layer 124A and the silicon nitride layer 124B, the inventive concept is not limited thereto. In some embodiments, the silicon nitride layer 124B may be omitted. In this case, the gate insulating spacer 124 may have a single-layer structure including the first carbon-containing insulating layer 124A.

Each of the plurality of interface layers 116 may be obtained by oxidizing an exposed surface of the fin-type active region FA, and may prevent interface defects between the fin-type active region FA and the gate insulating layers 118. In some embodiments, the plurality of interface layers 116 may include a low-K material layer having a dielectric constant of 9 or less, for example, a silicon oxide layer, a silicon oxynitride layer, a Ga oxide layer, a Ge oxide layer, or combinations thereof. In some other embodiments, the plurality of interface layers 116 may include a silicate or combinations of a silicate and the exemplary low-K material layer set forth above.

The plurality of gate insulating layers 118 may include a silicon oxide layer, a high-K dielectric layer, or combinations thereof. The high-K dielectric layer may include a material having a greater dielectric constant than a silicon oxide layer. For example, the gate insulating layers 118 may have a dielectric constant of about 10 to about 25. The high-K dielectric layer may include a material selected from among hafnium oxide, hafnium oxynitride, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and combinations thereof, but the material included in the high-K dielectric layer is not limited to the examples set forth above. The gate insulating layers 118 may be formed by an atomic layer deposition (ALD) process, a chemical vapor deposition (CVD) process, or a physical vapor deposition (PVD) process.

The plurality of gate lines GL extend, on the gate insulating layers 118, in a direction intersecting with the fin-type active region FA while covering the top surface and both sidewalls of each fin-type active region FA.

The gate lines GL may include a first metal-containing layer MGA and a second metal-containing layer MGB.

The first metal-containing layer MGA may adjust a work function. The second metal-containing layer MGB may fill a space formed above the first metal-containing layer MGA. In some embodiments, the first metal-containing layer MGA may include a metal including Ti, Ta, Al, and combinations thereof. In some embodiments, the first metal-containing layer MGA may include a Ti layer, a TiN layer, a TiON layer, a TiO layer, a Ta layer, a TaN layer, a TaON layer, an oxygen-doped TiAlN (referred to as TiAlN(O) hereinafter) layer, an oxygen-doped TaAlN (referred to as TaAlN(O) hereinafter) layer, or combinations thereof. In some other embodiments, the first metal-containing layer MGA may include a TiON layer, a TiO layer, a TaON layer, a TiAlN(O) layer, a TaAlN(O) layer, or combinations thereof. In some embodiments, the first metal-containing layer MGA may include a single layer or multiple layers.

The second metal-containing layer MGB may include an upper work-function-adjusting layer, a conductive barrier layer, a gap-fill metal layer, or combinations thereof. The upper work-function-adjusting layer may include TiAl, TiAlC, TiAlN, TiC, TaC, HfSi, or combinations thereof, without being limited thereto. The conductive barrier layer may include a metal nitride, for example, TiN, TaN, or combinations thereof, without being limited thereto. The gap-fill metal layer may fill a gate space remaining on the conductive barrier layer. The gap-fill metal layer may include tungsten (W). Each of the upper work-function-adjusting layer, the conductive barrier layer, and the gap-fill metal layer may be formed by an ALD, CVD, or PVD process. In some embodiments, at least one of the upper work-function-adjusting layer, the conductive barrier layer, and the gap-fill metal layer may be omitted.

In some embodiments, the gate lines GL may include a stacked structure of TiAlC/TiN/W, a stacked structure of TiN/TaN/TiAlC/TiN/W, or a stacked structure of TiN/TaN/TiN/TiAlC/TiN/W. In the stacked structures set forth above, a TiAlC layer or a TiN layer may serve as a metal-containing layer for adjusting work functions.

A source/drain region 120 is formed on the fin-type active region FA at one side of each gate line GL. The source/drain region 120 may include a semiconductor layer epitaxially grown on the fin-type active region FA. In some embodiments, the source/drain region 120 may have an embedded SiGe structure including a plurality of epitaxially grown SiGe layers. The plurality of SiGe layers may have different Ge contents. In some other embodiments, the source/drain region 120 may include an epitaxially grown Si layer or an epitaxially grown SiC layer. A recessed region 120R may be formed in a top surface of the source/drain region 120.

An inter-gate dielectric 132 is formed between the plurality of gate lines GL. The inter-gate dielectric 132 may be formed between two adjacent gate lines GL and cover the source/drain region 120. The inter-gate dielectric 132 may include a silicon oxide layer, without being limited thereto.

A blocking insulating layer 134 is formed on the plurality of gate lines GL and the inter-gate dielectric 132. An interlayer dielectric 136 is formed on the blocking insulating layer 134.

The source/drain region 120 is connected to a contact plug 160. The contact plug 160 extends from the recessed region 120R of the source/drain region 120 in the third direction (Z direction) perpendicular to the main plane (X-Y plane) of the substrate 110.

The contact plug 160 may penetrate the interlayer dielectric 136, the blocking insulating layer 134, and the inter-gate dielectric 132 and be electrically connected to the source/drain region 120.

The contact plug 160 includes a conductive barrier layer 162 and a conductive plug 164, which are formed on the source/drain region 120 in this stated order. The conductive barrier layer 162 may conformally surround an outer surface of the conductive plug 164. A cross-sectional shape of the contact plug 160 according to the X-Y plane may be a circular, elliptical, or polygonal shape, but the cross-sectional shape of the contact plug 160 is not limited thereto.

The conductive barrier layer 162 included in the contact plug 160 may include a conductive metal nitride layer. For example, the conductive barrier layer 162 may include TiN, TaN, AlN, WN, or combinations thereof. The conductive plug 164 included in the contact plug 160 may include W, Cu, Al, alloys thereof, or combinations thereof.

However, materials of the conductive barrier layer 162 and the contact plug 160 are not limited to the examples set forth above.

A contact insulating spacer 144 is formed on the source/drain region 120 and surrounds a lower portion of the contact plug 160. The contact insulating spacer 144 may include a second carbon-containing insulating layer 144A contacting the conductive barrier layer 162 of the contact plug 160. Although the contact insulating spacer 144 is shown in FIGS. 1B and 1C as having a single-layer structure including only the second carbon-containing insulating layer 144A, the inventive concept is not limited to the example shown in FIGS. 1B and 1C. The contact insulating spacer 144 may have a multilayer structure which includes a plurality of insulating layers including different insulating materials.

The inter-gate dielectric 132 is between the contact insulating spacer 144 and the gate insulating spacer 124.

The contact plug 160 is surrounded by the contact insulating spacer 144, the inter-gate dielectric 132, the gate insulating spacer 124, the blocking insulating layer 134, and the interlayer dielectric 136 and thus may be insulated from other surrounding conductive layers.

The gate insulating spacer 124, the inter-gate dielectric 132, and the contact insulating spacer 144 are located on sidewalls of the gate lines GL in this stated order and between the gate lines GL and the contact plug 160, and may constitute a multilayer-structured insulating spacer MSP1.

In some embodiments, the first carbon-containing insulating layer 124A may cover a surface of the inter-gate dielectric 132 which faces towards the gate lines GL away from the contact plug 160 and the second carbon-containing insulating layer 144A may cover a surface of the inter-gate dielectric 132 which faces towards the contact plug 160 away from the gate lines GL. For example, in some embodiments, the inter-gate dielectric 132 may be provided between first carbon-containing insulating layer 124A and the second carbon-containing insulating layer 144A in a manner such that the first carbon-containing insulating layer 124A of the gate insulating spacer 124 may contact a first sidewall of the inter-gate dielectric 132 adjacent to the gate lines GL and the second carbon-containing insulating layer 144A may contact a second sidewall of the inter-gate dielectric 132, opposite to the first sidewall of the inter-date dielectric 132, adjacent to the contact plug 160. The insulating spacer MSP1 is between the gate lines GL and the contact plug 160, whereby the insulating spacer MSP1 may prevent an electrical short circuit therebetween, provide a sufficiently low dielectric constant, and suppress the occurrence of leakage currents therebetween.

In some embodiments, the first carbon-containing insulating layer 124A of the gate insulating spacer 124, and the second carbon-containing insulating layer 144A of the contact insulating spacer 144 may have different carbon contents. In some embodiments, the first carbon-containing insulating layer 124A may have a first carbon content, and the second carbon-containing insulating layer 144A may have a second carbon content that is greater than the first carbon content. For example, the first carbon-containing insulating layer 124A may have a carbon content selected from a range of about 5 atom % to about 15 atom %, and the second carbon-containing insulating layer 144A may have a carbon content which is selected from a range of about 10 atom % to about 25 atom % and is greater than the carbon content in the first carbon-containing insulating layer 124A. For example, in some embodiments, a ratio of a carbon content of the first carbon-containing insulating layer 12A to a carbon content of the second carbon-containing insulating layer 144A may be a value ranging from about 0.5 to about 0.6.

In some embodiments, each of the first carbon-containing insulating layer 124A and the second carbon-containing insulating layer 144A may include SiCN, SiOCN, or combinations thereof. SiCN refers to a material containing silicon (Si), carbon (C), and nitrogen (N). SiOCN refers to a material containing silicon (Si), oxygen (O), carbon (C), and nitrogen (N).

In one embodiment, the first carbon-containing insulating layer 124A may include a SiOCN layer having a first carbon content selected from a range of about 5 atom % to about 15 atom %, and the second carbon-containing insulating layer 144A may include a SiOCN or SiCN layer having a second carbon content that is greater than the first carbon content.

In another embodiment, the first carbon-containing insulating layer 124A may include a SiOCN layer having a first oxygen content selected from a range of about 25 atom % to about 50 atom %, and the second carbon-containing insulating layer 144A may include a SiOCN or SiCN layer having a second oxygen content that is less than the first oxygen content.

The blocking insulating layer 134 and the interlayer dielectric 136 may surround the contact plug 160 while covering the gate lines GL and the multilayer-structured insulating spacer MSP1. In some embodiments, the blocking insulating layer 134 may include the same material as a material of one of the first carbon-containing insulating layer 124A and the second carbon-containing insulating layer 144A. In one embodiment, the blocking insulating layer 134 may include the same material as the first carbon-containing insulating layer 124A. In another embodiment, the blocking insulating layer 134 may include the same material as the second carbon-containing insulating layer 144A.

In some embodiments, a width of the second carbon-containing insulating layer 144A is less than a width of the first carbon-containing insulating layer 124A. A width of a portion of the inter-gate dielectric 132 may be less than the width of the first carbon-containing insulating layer 124A, the portion of the inter-gate dielectric 132 being between the contact insulating spacer 144 and the gate insulating spacer 124. For example, each of the first carbon-containing insulating layer 124A and the silicon nitride layer 124B may have a width of about 2 nm to about 10 nm. In some embodiments, the width of the first carbon-containing insulating layer 124A may be equal to the width of the silicon nitride layer 124B. In some other embodiments, the width of the first carbon-containing insulating layer 124A may be greater than the width of the silicon nitride layer 124B. In some embodiments, a sum of the widths of the first carbon-containing insulating layer 124A and the silicon nitride layer 124B may range from about 5 nm to about 20 nm. The width of the second carbon-containing insulating layer 144A may range from about 1 nm to about 5 nm. The width of the portion of the inter-gate dielectric 132 may range from about 1 nm to about 5 nm, the portion of the inter-gate dielectric 132 being between the contact insulating spacer 144 and the gate insulating spacer 124. However, the values of the widths set forth above are merely examples and may be variously modified and changed without departing from the spirit and scope of the inventive concept.

Figure 2:
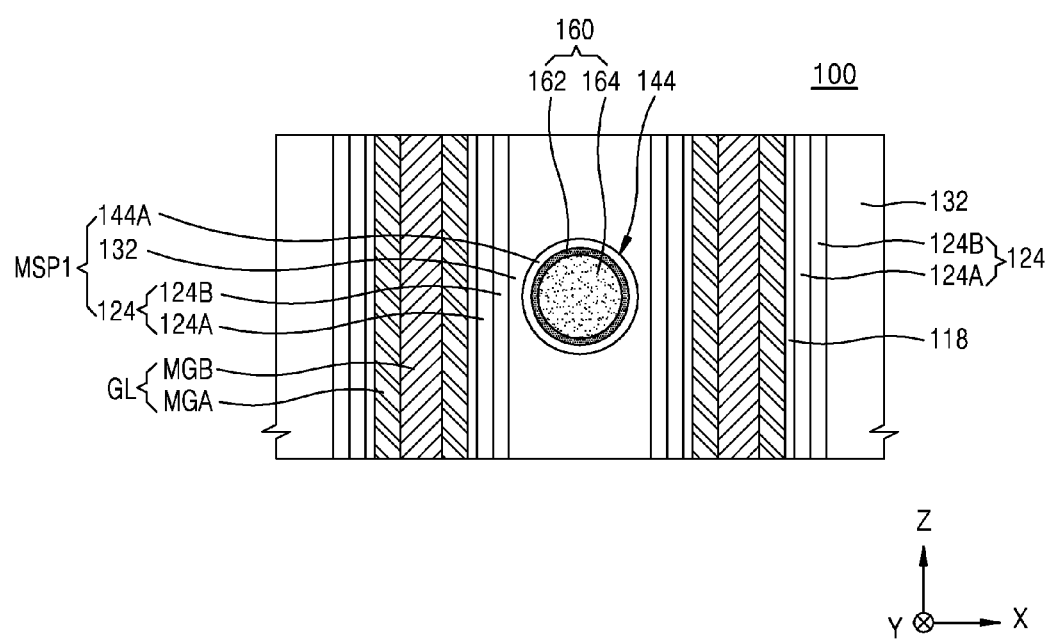
FIG. 2 is a plan view of the integrated circuit device according to exemplary embodiments, which is obtained by a cross-section taken along a line II-II' of FIG. 1B.

FIG. 2 is a plan view of the integrated circuit device 100, which is obtained by a cross-section taken along a line II-II' of FIG. 1B, and shows planar shapes of some components of the integrated circuit device 100 of FIGS. 1A to 1C.

As shown in FIG. 2, the first carbon-containing insulating layer 124A may linearly extend, on the sidewalls of the gate lines GL, along a length direction of the gate lines GL. In addition, the second carbon-containing insulating layer 144A may have a ring shape on the source/drain region 120, the ring shape surrounding the lower portion of the contact plug 160.

Although FIG. 2 shows an example in which the contact plug 160 approximately has a cross-sectional shape of a circle and the second carbon-containing insulating layer 144A surrounding the contact plug 160 approximately has a cross-sectional shape of a circular ring, the inventive concept is not limited to the shapes shown in FIG. 2. For example, the contact plug 160 may have a cross-sectional shape of an ellipse or polygon, and correspondingly, the second carbon-containing insulating layer 144A may have a cross-sectional shape of an elliptical or polygonal ring. In some embodiments, the second carbon-containing insulating layer 144A may have a varying thickness extending from an upper surface of the contact plug 160 towards the substrate 110 such that a first sidewall of the second carbon-containing insulating layer 144A with respect to a sidewall of the contact plug 160 may be concave and a second sidewall of the second carbon-containing insulating layer 144A with respect to the same sidewall of the contact plug 160 may be convex.

Referring again to FIGS. 1A to 1C, a metal silicide layer 140 may be formed between the source/drain region 120 and the contact plug 160. The metal silicide layer 140 may be formed along an inner wall of recessed region 120R.

The metal silicide layer 140 may have a decreasing thickness with increasing distance from the substrate 110 in an upward direction (e.g., Z direction—perpendicular to the main plane of the substrate 110). In some embodiments, the metal silicide layer 140 may include a metal silicide layer including a dopant. The dopant may include at least one element selected from among carbon group elements and inert elements. For example, the metal silicide layer 140 may be represented by a compositional formula of $MSi_xD_y$. Here, M is a metal, D is an element that is different from M and Si, $0<x\leq3$, and $0<y\leq1$. In some embodiments, M may include Ti, W, Ru, Nb, Mo, Hf, Ni, Co, Pt, Yb, Tb, Dy, Er, Pd, or combinations thereof. In some embodiments, D may include Ge, C, Ar, Kr, Xe, or combinations thereof.

In some embodiments, as shown in FIG. 1B, the metal silicide layer 140 may contact the conductive barrier layer 162. However, the inventive concept is not limited thereto. In some other embodiments, a metal layer (not shown) may be between the metal silicide layer 140 and the conductive barrier layer 162, the metal layer including the same material as a metal included in the metal silicide layer 140. For example, when the metal silicide layer 140 includes titanium silicide, the metal layer may include titanium.

The source/drain region 120 may have a raised source/drain (RSD) structure having a top surface that is at a higher level than a top surface of the fin-type active region FA.

The inter-gate dielectric 132 may be formed between two adjacent gate lines GL and cover the source/drain region 120.

The blocking insulating layer 134 prevents undesired foreign substances such as oxygen from penetrating into the plurality of gate lines GL, thereby preventing an undesired change in threshold voltage in the gate lines GL, or a short circuit which may occur between the gate lines GL and the contact plug 160. The blocking insulating layer 134 is formed, thereby maintaining a constant threshold voltage in the gate lines GL and preventing deterioration in electrical characteristics of a transistor including the gate lines GL. In some embodiments, the blocking insulating layer 134 may include a layer including silicon and nitrogen. For example, the blocking insulating layer 134 may include a silicon nitride layer, a silicon oxynitride (SiON) layer, a silicon carbonitride (SiCN) layer, a carbon-containing silicon oxynitride (SiOCN) layer, or combinations thereof. In some embodiments, the blocking insulating layer 134 may have a thickness of about 20 Å to about 50 Å.

The interlayer dielectric 136 may include a silicon oxide layer, without being limited thereto.

In some embodiments, at least one of the inter-gate dielectric 132 and the interlayer dielectric 136 may include a tetraethyl orthosilicate (TEOS) layer. In some other embodiments, at least one of the inter-gate dielectric 132 and the interlayer dielectric 136 may include an ultra-low-K (ULK) layer having an ultra-low dielectric constant K of about 2.2 to about 2.4, for example, one layer selected from a SiOC layer and a SiCOH layer.

Figure 3A:
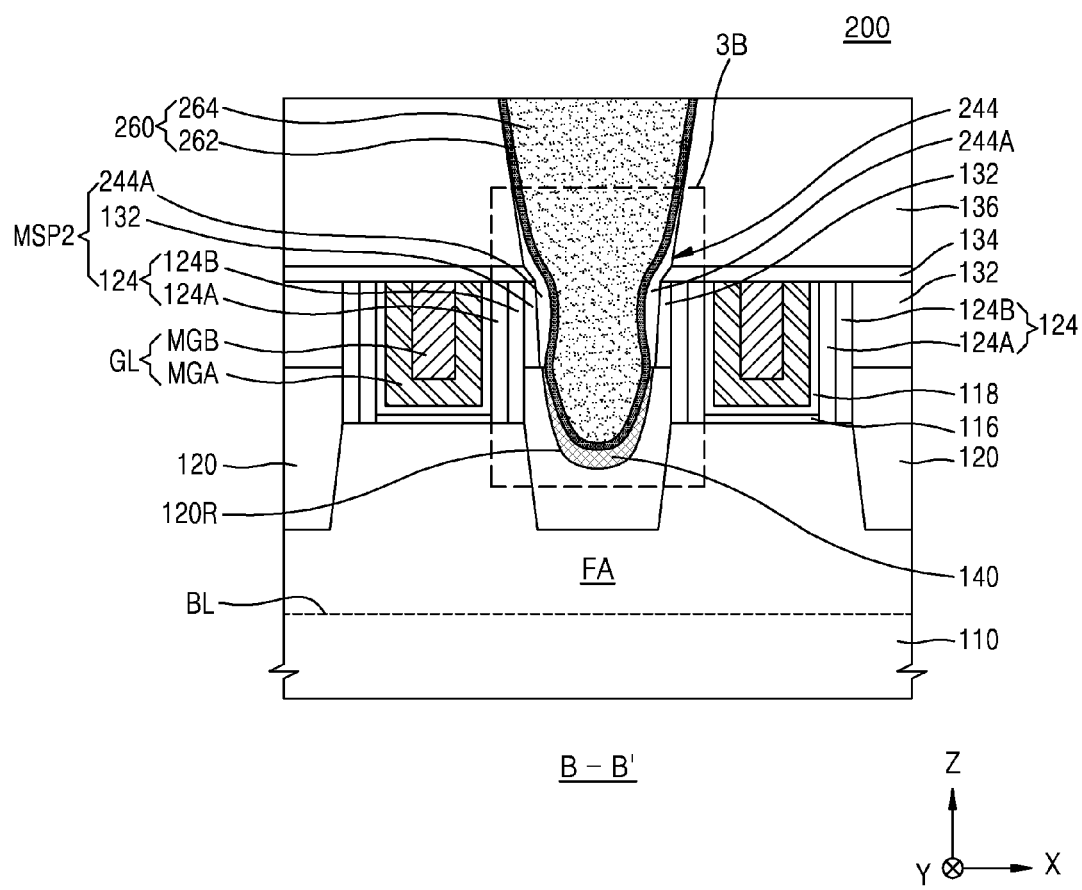
FIGS. 3A and 3B are diagrams for explaining an integrated circuit device according to other exemplary embodiments.
Figure 3B:
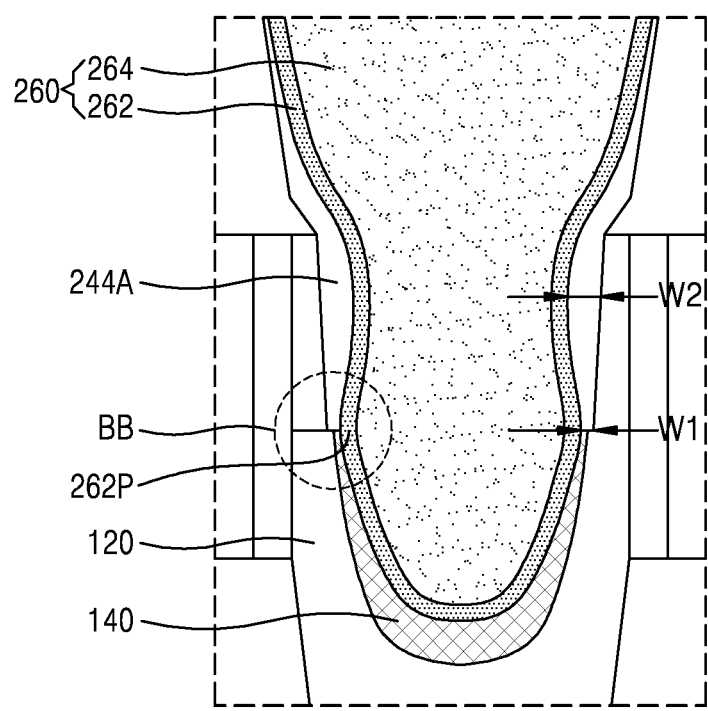

FIGS. 3A and 3B are diagrams for explaining an integrated circuit device according to other exemplary embodiments, FIG. 3A is a cross-sectional view of the integrated circuit device, which corresponds to the cross-section taken along the line B-B' of FIG. 1A, and FIG. 3B is an enlarged view showing some components of the integrated circuit device included in a dashed-line area marked by 3B in FIG. 3A. In FIGS. 3A and 3B, the same reference numerals as in FIGS. 1A to 1C denote the same members, and descriptions thereof will be omitted.

An integrated circuit device 200 shown in FIGS. 3A and 3B has mostly the same configuration as the integrated circuit device 100 described with reference to FIGS. 1A to 1C. However, the integrated circuit device 200 shown in FIGS. 3A and 3B differs from the integrated circuit device 100 of FIGS. 1A to 1C in that a shape of a second carbon-containing insulating layer 244A included in a contact insulating spacer 244 surrounding a lower portion of a contact plug 260 differs from the shape of the second carbon-containing insulating layer 144A included in the contact insulating spacer 144 shown in FIGS. 1B and 1C.

Referring to FIGS. 3A and 3B, the contact insulating spacer 244 is formed on the source/drain region 120 and surrounds the lower portion of the contact plug 260. The contact insulating spacer 244 includes the second carbon-containing insulating layer 244A contacting a conductive barrier layer 262 of the contact plug 260.

A width W1 of a bottom surface of the second carbon-containing insulating layer 244A is less than a maximum width of a middle portion of the second carbon-containing insulating layer 244A, the bottom surface of the second carbon-containing insulating layer 244A being closest to the substrate 110. For example, the width W1 of the bottom surface is less than a maximum width W2 of a portion of the second carbon-containing insulating layer 244A, which is surrounded by the inter-gate dielectric 132.

In addition, the contact plug 260 includes the conductive barrier layer 262 and a conductive plug 264, which are formed on the source/drain region 120 in this stated order. A portion of the conductive barrier layer 262 may extend along a surface profile of the second carbon-containing insulating layer 244A, the portion of the conductive barrier layer 262 contacting the second carbon-containing insulating layer 244A. Thus, as shown in a dashed-line area marked by BB in FIG. 3B, the conductive barrier layer 262 may have a protrusion 262P which protrudes in a direction away from the conductive plug 264 with decreasing distance from the bottom surface of the second carbon-containing insulating layer 244A. Further, similarly to the conductive barrier layer 262, the conductive plug 264 may also have a protrusion which protrudes outwards with decreasing distance from the bottom surface of the second carbon-containing insulating layer 244A.

More details of the second carbon-containing insulating layer 244A, the conductive barrier layer 262, and the conductive plug 264 are mostly the same as the details of the second carbon-containing insulating layer 144A, the conductive barrier layer 162, and the conductive plug 164, which have been described with reference to FIGS. 1A to 1C.

Although the contact insulating spacer 244 is shown in FIGS. 3A and 3B as having a single-layer structure including only the second carbon-containing insulating layer 244A, the inventive concept is not limited to the example shown in FIGS. 3A and 3B. The contact insulating spacer 244 may have a multilayer structure which includes a plurality of insulating layers including different insulating materials.

In the integrated circuit device 200 shown in FIGS. 3A and 3B, a multilayer-structured insulating spacer MSP2 is between the gate lines GL and the contact plug 260, the multilayer-structured insulating spacer MSP2 including the gate insulating spacer 124, the inter-gate dielectric 132, and the contact insulating spacer 244, which are located on the sidewalls of the gate lines GL in this stated order. The insulating spacer MSP2 is between the gate lines GL and the contact plug 260, whereby the insulating spacer MSP2 may prevent an electrical short circuit therebetween, provide a sufficiently low dielectric constant, and suppress the occurrence of leakage currents therebetween.

Figure 4A:
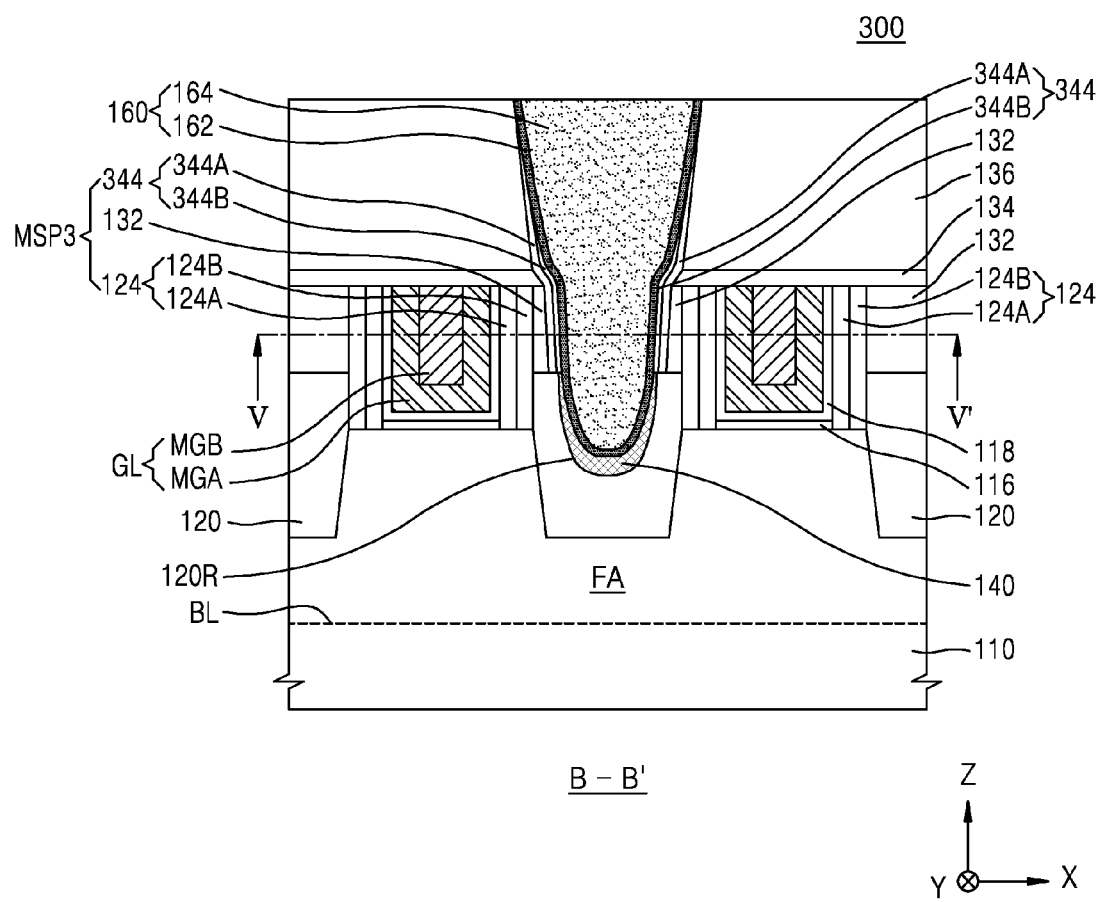
FIGS. 4A and 4B are diagrams for explaining an integrated circuit device according to further exemplary embodiments.
Figure 4B:
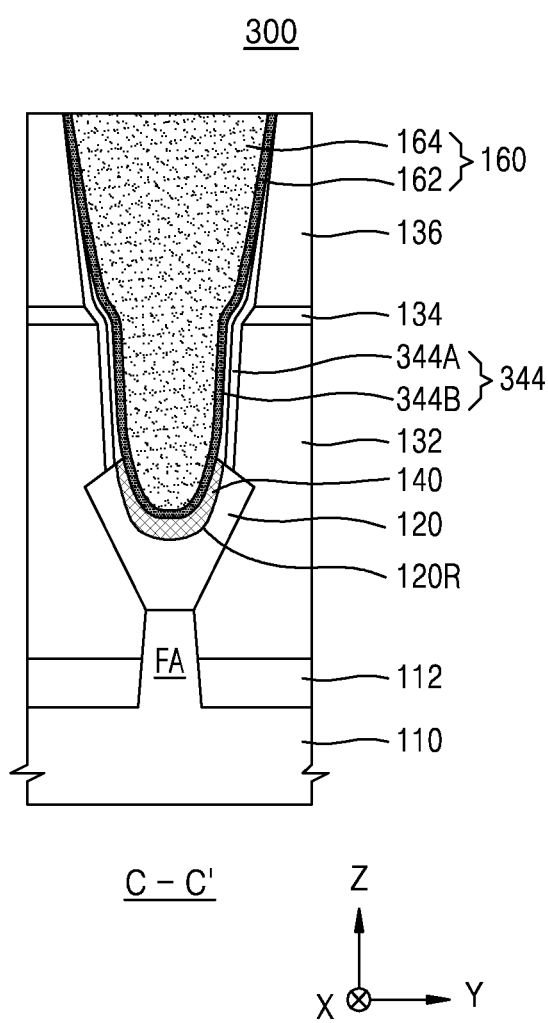

FIGS. 4A and 4B are diagrams for explaining an integrated circuit device according to further exemplary embodiments, FIG. 4A is a cross-sectional view of the integrated circuit device, which corresponds to the cross-section taken along the line B-B' of FIG. 1A, and FIG. 4B is a cross-sectional view of the integrated circuit device, which corresponds to the cross-section taken along the line C-C' of FIG. 1A. In FIGS. 4A and 4B, the same reference numerals as in FIGS. 1A to 1C denote the same members, and descriptions thereof will be omitted.

An integrated circuit device 300 shown in FIGS. 4A and 4B has mostly the same configuration as the integrated circuit device 100 described with reference to FIGS. 1A to 1C. However, in the integrated circuit device 300 shown in FIGS. 4A and 4B, a contact insulating spacer 344 surrounding the lower portion of the contact plug 160 includes a silicon nitride layer 344A and a second carbon-containing insulating layer 344B, the silicon nitride layer 344A covering the conductive barrier layer 162, and the second carbon-containing insulating layer 344B being between the conductive barrier layer 162 and the silicon nitride layer 344A and contacting the conductive barrier layer 162. The silicon nitride layer 344A is between the inter-gate dielectric 132 and the second carbon-containing insulating layer 344B and may surround the lower portion of the contact plug 160.

In some embodiments, a thickness of the second carbon-containing insulating layer 344B may be less than a thickness of the silicon nitride layer 344A. In some other embodiments, the thickness of the second carbon-containing insulating layer 344B may be equal to or greater than the thickness of the silicon nitride layer 344A. Each of the silicon nitride layer 344A and the second carbon-containing insulating layer 344B may have a thickness selected from a range of about 1 nm to about 5 nm, without being limited thereto.

Figure 5:
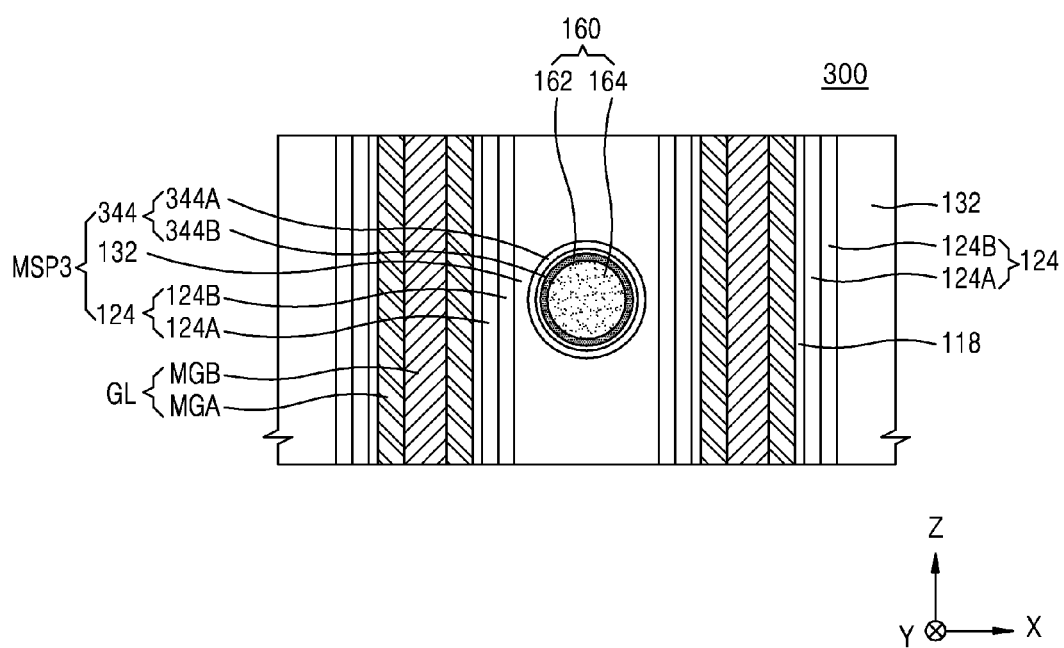
FIG. 5 is a plan view of the integrated circuit device according to exemplary embodiments, which is obtained by a cross-section taken along a line V-V' of FIG. 4A.

FIG. 5 is a plan view of the integrated circuit device 300, which is obtained by a cross-section taken along a line V-V' of FIG. 4A, and shows planar shapes of some components of the integrated circuit device 300 of FIGS. 4A and 4B.

As shown in FIG. 5, the first carbon-containing insulating layer 124A may linearly extend, on the sidewalls of the gate lines GL, along the length direction of the gate lines GL. In addition, the contact insulating spacer 344 including the silicon nitride layer 344A and the second carbon-containing insulating layer 344B may have a ring shape on the source/drain region 120, the ring shape surrounding the lower portion of the contact plug 160.

Although FIG. 5 shows an example in which the contact plug 160 approximately has a cross-sectional shape of a circle and the contact insulating spacer 344 surrounding the contact plug 160 approximately has a cross-sectional shape of a circular ring, the cross-sectional shape is not limited to the shapes shown in FIG. 5. For example, the contact plug 160 may have a cross-sectional shape of an ellipse or polygon, and correspondingly, the contact insulating spacer 344 may have a cross-sectional shape of an elliptical or polygonal ring.

Figure 6A:
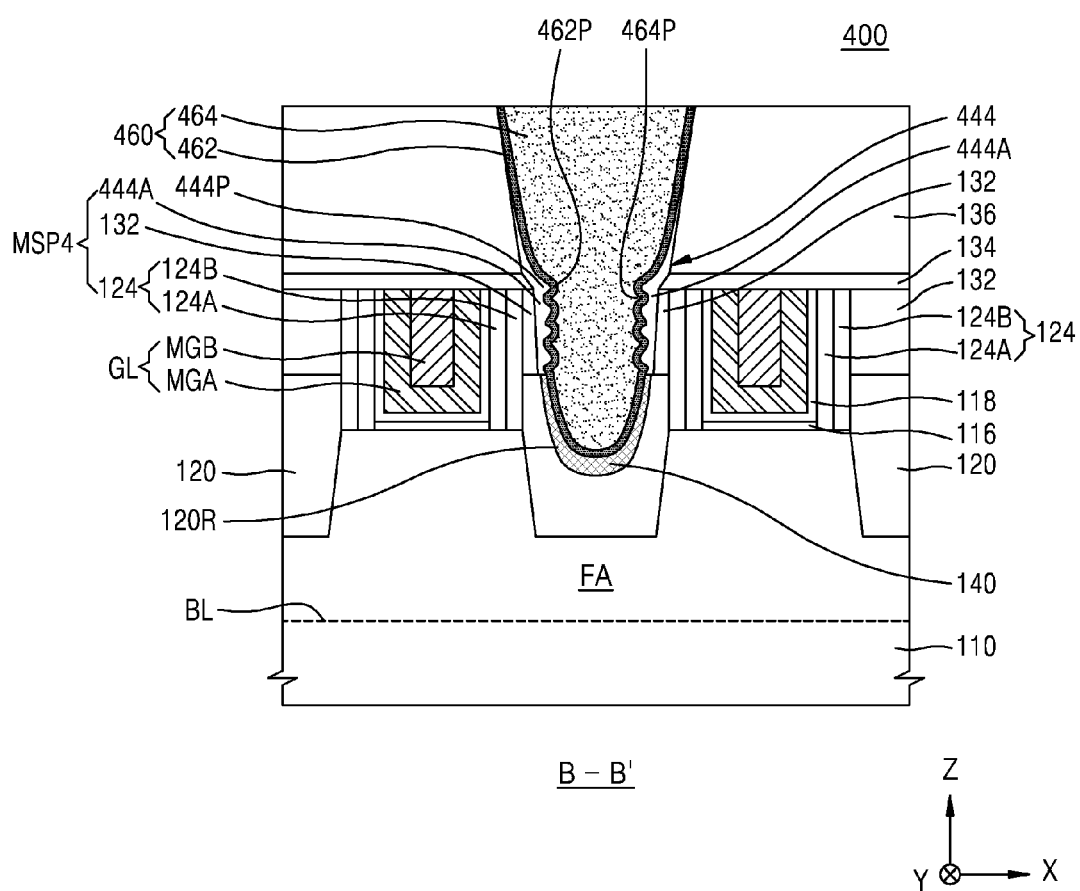
FIGS. 6A and 6B are diagrams for explaining an integrated circuit device according to yet other exemplary embodiments.
Figure 6B:
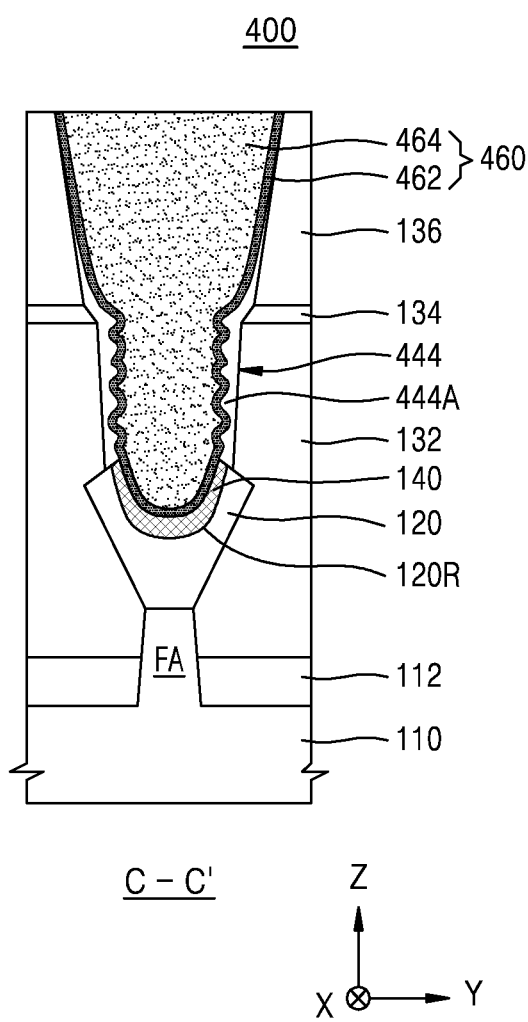

FIGS. 6A and 6B are diagrams for explaining an integrated circuit device according to yet other exemplary embodiments, FIG. 6A is a cross-sectional view of the integrated circuit device, which corresponds to the cross-section taken along the line B-B' of FIG. 1A, and FIG. 6B is a cross-sectional view of the integrated circuit device, which corresponds to the cross-section taken along the line C-C' of FIG. 1A. In FIGS. 6A and 6B, the same reference numerals as in FIGS. 1A to 1C denote the same members, and descriptions thereof will be omitted.

An integrated circuit device 400 shown in FIGS. 6A and 6B has mostly the same configuration as the integrated circuit device 100 described with reference to FIGS. 1A to 1C. However, in the integrated circuit device 400 shown in FIGS. 6A and 6B, a contact plug 460 includes a conductive barrier layer 462 and a conductive plug 464. A contact insulating spacer 444 surrounding a lower portion of the contact plug 460 includes a second carbon-containing insulating layer 444A contacting the conductive barrier layer 462 of the contact plug 460.

A surface of the second carbon-containing insulating layer 444A, which contacts the conductive barrier layer 462, has an uneven structure 444P. In addition, an uneven structure 462P is also formed in a portion of the conductive barrier layer 462, which faces the uneven structure 444P of the second carbon-containing insulating layer 444A. In some embodiments, like in the conductive barrier layer 462, an uneven structure 464P may also be formed in a portion of the conductive plug 464, which faces the uneven structure 444P of the second carbon-containing insulating layer 444A. In some other embodiments, unlike in the conductive barrier layer 462, the portion of the conductive plug 464 may have a relatively smooth surface instead of having an uneven structure, the portion of the conductive plug 464 facing the uneven structure 444P of the second carbon-containing insulating layer 444A. In some embodiments, the uneven structure 444P of the surface of the second carbon-containing insulating layer 444A may extend from the lower-most surface of the second carbon-containing insulating layer 444A to the upper-most surface of the inter-gate dielectric 132, but the disclosure is not limited thereto. For example, in some embodiments, the uneven structure 444P of the surface of the second carbon-containing insulating layer 444A may extend from the lower-most surface of the second carbon-containing insulating layer 444A to the upper-most surface of the blocking insulating layer 134.

Although the contact insulating spacer 444 is shown in FIGS. 6A and 6B as having a single-layer structure including only the second carbon-containing insulating layer 444A, the disclosure is not limited to the example shown in FIGS. 6A and 6B. The contact insulating spacer 444 may have a multilayer structure which includes a plurality of insulating layers including different insulating materials.

More details of the second carbon-containing insulating layer 444A, the conductive barrier layer 462, and the conductive plug 464 are mostly the same as the details of the second carbon-containing insulating layer 144A, the conductive barrier layer 162, and the conductive plug 164, which have been described with reference to FIGS. 1A to 1C.

In the second carbon-containing insulating layer 344B included in the contact insulating spacer 344 of the integrated circuit device 300 shown in FIGS. 4A and 4B, like in the second carbon-containing insulating layer 444A shown in FIGS. 6A and 6B, a surface of the second carbon-containing insulating layer 344B, which contacts the conductive barrier layer 162, may also have an uneven structure, although not shown. In this case, the silicon nitride layer 344A and/or the conductive barrier layer 162 may also include a similar uneven structure due to the transfer of a shape of the uneven structure of the surface of the second carbon-containing insulating layer 344B, or may have a non-smooth surface due to deformation caused by the uneven structure of the surface of the second carbon-containing insulating layer 344B.

Figure 7A:
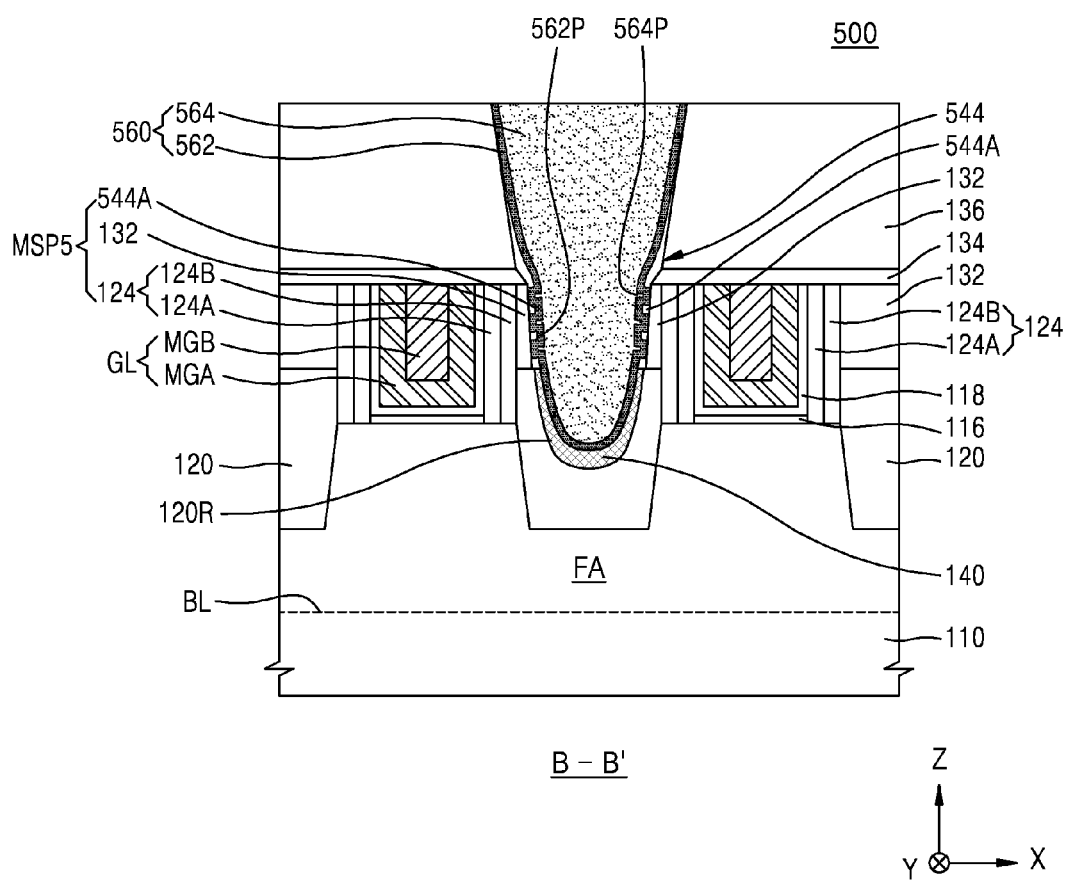
FIGS. 7A and 7B are diagrams for explaining an integrated circuit device according to yet other exemplary embodiments.
Figure 7B:
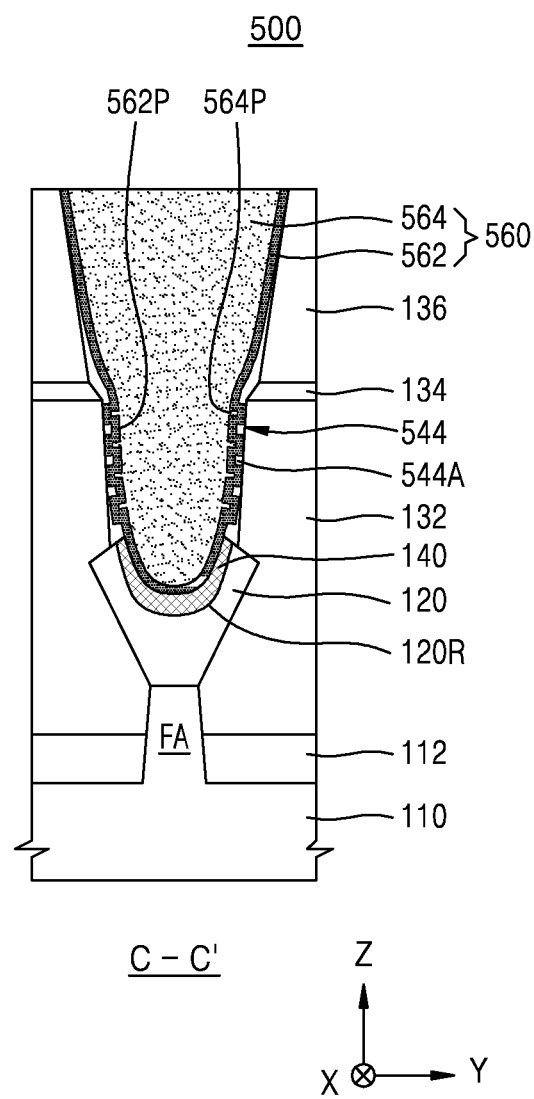

FIGS. 7A and 7B are diagrams for explaining an integrated circuit device according to yet other exemplary embodiments, FIG. 7A is a cross-sectional view of the integrated circuit device, which corresponds to the cross-section taken along the line B-B' of FIG. 1A, and FIG. 7B is a cross-sectional view of the integrated circuit device, which corresponds to the cross-section taken along the line C-C' of FIG. 1A. In FIGS. 7A and 7B, the same reference numerals as in FIGS. 1A to 1C denote the same members, and descriptions thereof will be omitted.

An integrated circuit device 500 shown in FIGS. 7A and 7B has mostly the same configuration as the integrated circuit device 100 described with reference to FIGS. 1A to 1C. However, in the integrated circuit device 500 shown in FIGS. 7A and 7B, a contact plug 560 includes a conductive barrier layer 562 and a conductive plug 564. A contact insulating spacer 544 surrounding a lower portion of the contact plug 560 includes a second carbon-containing insulating layer 544A contacting the conductive barrier layer 562 of the contact plug 560.

At least a portion of the second carbon-containing insulating layer 544A intermittently extends along an extension direction of the contact plug 560 or along the third direction (Z direction) perpendicular to the main plane of the substrate 110.

An uneven structure 562P is formed in a portion of the conductive barrier layer 562, which faces the intermittent structure of the second carbon-containing insulating layer 544A. In some embodiments, like in the conductive barrier layer 562, an uneven structure 564P may be formed in a portion of the conductive plug 564, which faces the intermittent structure of the second carbon-containing insulating layer 544A. In some embodiments, the uneven structure 562P of the conductive barrier layer 562 and the uneven structure 564P of the conductive plug 564 may extend from the lower-most surface of the second carbon-containing insulating layer 544A to the upper-most surface of the inter-gate dielectric 132, but the disclosure is not limited thereto. For example, in some embodiments, the uneven structure 562P of the conductive barrier layer 562 and the uneven structure 564P of the conductive plug 564 may extend from the lower-most surface of the second carbon-containing insulating layer 544A to the upper-most surface of blocking insulating layer 134. In some other embodiments, unlike in the example shown in FIGS. 7A and 7B, the portion of the conductive plug 564 may have a relatively smooth surface instead of having an uneven structure, the portion of the conductive plug 464 facing the intermittent structure of the second carbon-containing insulating layer 544A.

Although the contact insulating spacer 544 is shown in FIGS. 7A and 7B as having a single-layer structure including only the second carbon-containing insulating layer 544A, the inventive concept is not limited to the example shown in FIGS. 5A and 5B. The contact insulating spacer 544 may have a multilayer structure which includes a plurality of insulating layers including different insulating materials.

More details of the second carbon-containing insulating layer 544A, the conductive barrier layer 562, and the conductive plug 564 are mostly the same as the details of the second carbon-containing insulating layer 144A, the conductive barrier layer 162, and the conductive plug 164, which have been described with reference to FIGS. 1A to 1C.

Although not shown, similarly to the second carbon-containing insulating layer 544A shown in FIGS. 7A and 7B, at least one of the silicon nitride layer 344A and the second carbon-containing insulating layer 344B may intermittently extend along an extension direction of the contact plug 160 or along the third direction (Z direction) perpendicular to the main plane of the substrate 110, the silicon nitride layer 344A and the second carbon-containing insulating layer 344B constituting the contact insulating spacer 344 of the integrated circuit device 300 shown in FIGS. 4A and 4B.

Figure 8:
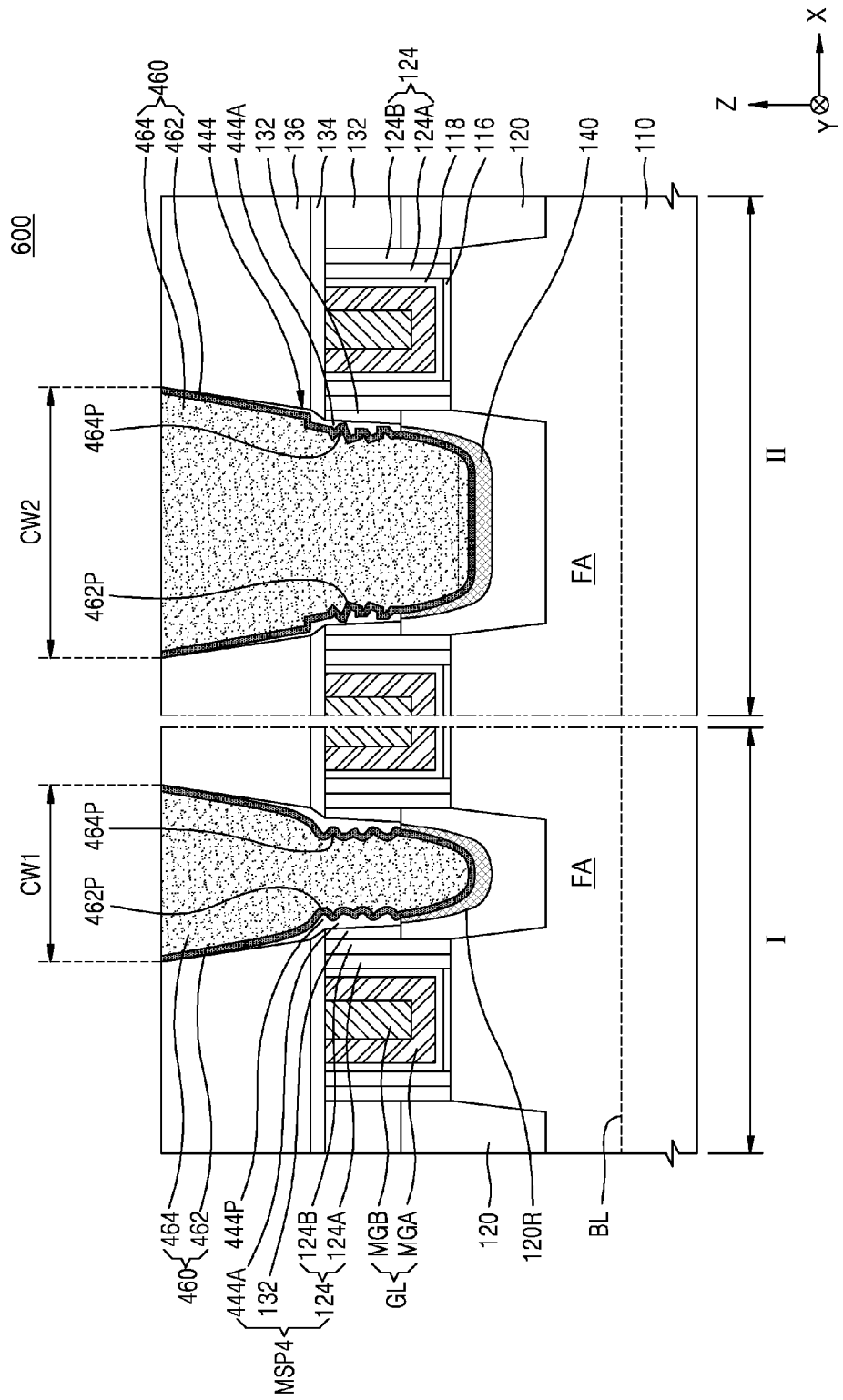
FIG. 8 is a cross-sectional view for explaining an integrated circuit device according to yet other exemplary embodiments.

FIG. 8 is a cross-sectional view for explaining an integrated circuit device according to yet other exemplary embodiments. In FIG. 8, the same reference numerals as in FIGS. 1A to 1C denote the same members, and descriptions thereof will be omitted.

An integrated circuit device 600 shown in FIG. 8 has a mostly similar configuration to the integrated circuit device 400 shown in FIGS. 6A and 6B. However, in the integrated circuit device 600 shown in FIG. 8, a degree of unevenness of the uneven structure of the contact insulating spacer 444 varies with the width of the contact plug, the contact insulating spacer 444 surrounding the lower portion of the contact plug.

A specific example will be described in detail. The substrate 110 of the integrated circuit device 600 has a first device region I and a second device region II.

In some embodiments, the first device region I and the second device region II may be regions performing different functions. In some other embodiments, the first device region I may be a region in which devices operating in a low-power mode are formed, and the second device region II may be a region in which devices operating in a high-power mode are formed. In some further embodiments, the first device region I may be a region in which a memory device or a logic circuit is formed, and the second device region II may be a region in which a peripheral circuit such as an input/output (I/O) device is formed.

In the integrated circuit device 600 shown in FIG. 8, the first device region I and the second device region II may have mostly the same configuration. However, a pattern formation density in the second device region II may be less than a pattern formation density in the first device region I. Thus, a width of the source/drain region 120 in the second device region II may be greater than a width of the source/drain region 120 in the first device region I. In addition, a width CW2 of the contact plug 460 in the second device region II may be greater than a width CW1 of the contact plug 460 in the first device region I. In this case, a degree of unevenness of the uneven structure 444P of the second carbon-containing insulating layer 444A surrounding the contact plug 460 in the second device region II may be greater than a degree of unevenness of the uneven structure 444P of the second carbon-containing insulating layer 444A surrounding the contact plug 460 in the first device region I, the contact plug 460 in the second device region II having the relatively large width CW2, the contact plug 460 in the first device region I having the relatively small width CW1.

In some embodiments, like in the example described with reference to FIGS. 6A and 6B, the uneven structure 444P of the second carbon-containing insulating layer 444A in each of the first device region I and the second device region II may continuously extend along the extension direction (Z direction) of the contact plug 460 rather than locally intermittently extending along the extension direction (Z direction) of the contact plug 460. In some other embodiments, while the uneven structure 444P of the second carbon-containing insulating layer 444A in the first device region I may continuously extend like in the example described with reference to FIGS. 6A and 6B, the uneven structure 444P of the second carbon-containing insulating layer 444A in the second device region II may intermittently extend like in the example described with reference to FIGS. 7A and 7B.

Figure 9A:
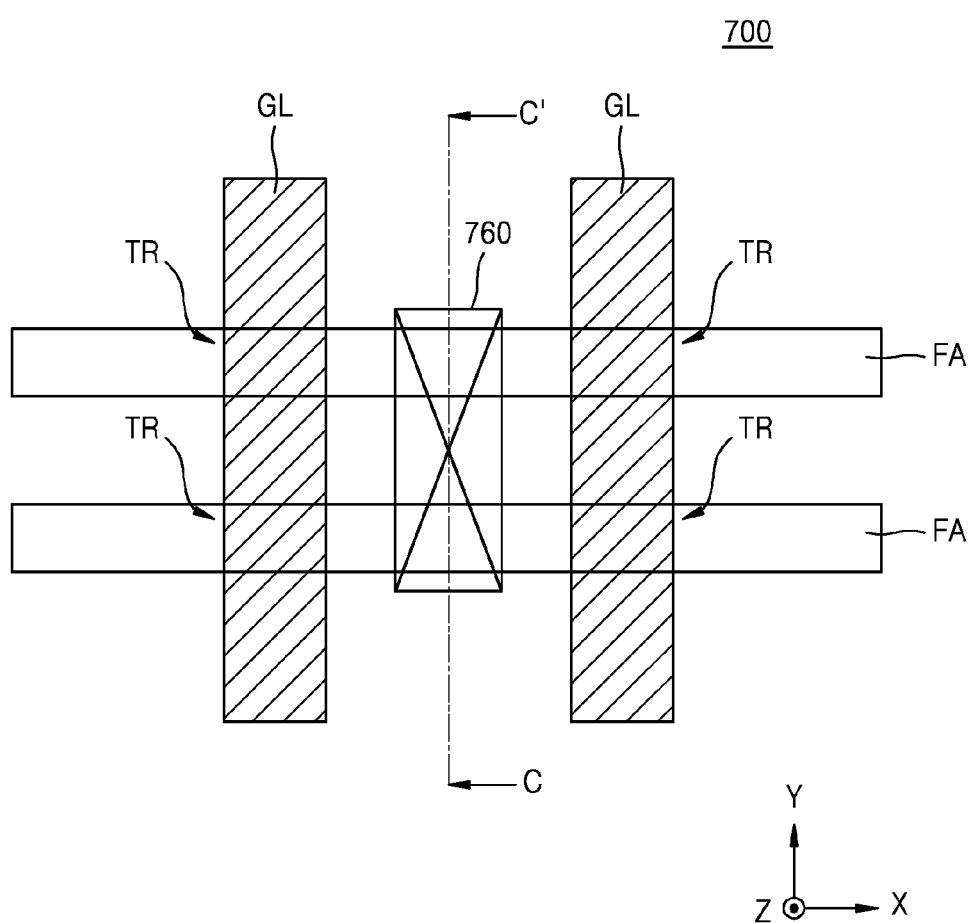
FIGS. 9A and 9B are diagrams for explaining an integrated circuit device according to yet other exemplary embodiments.
Figure 9B:
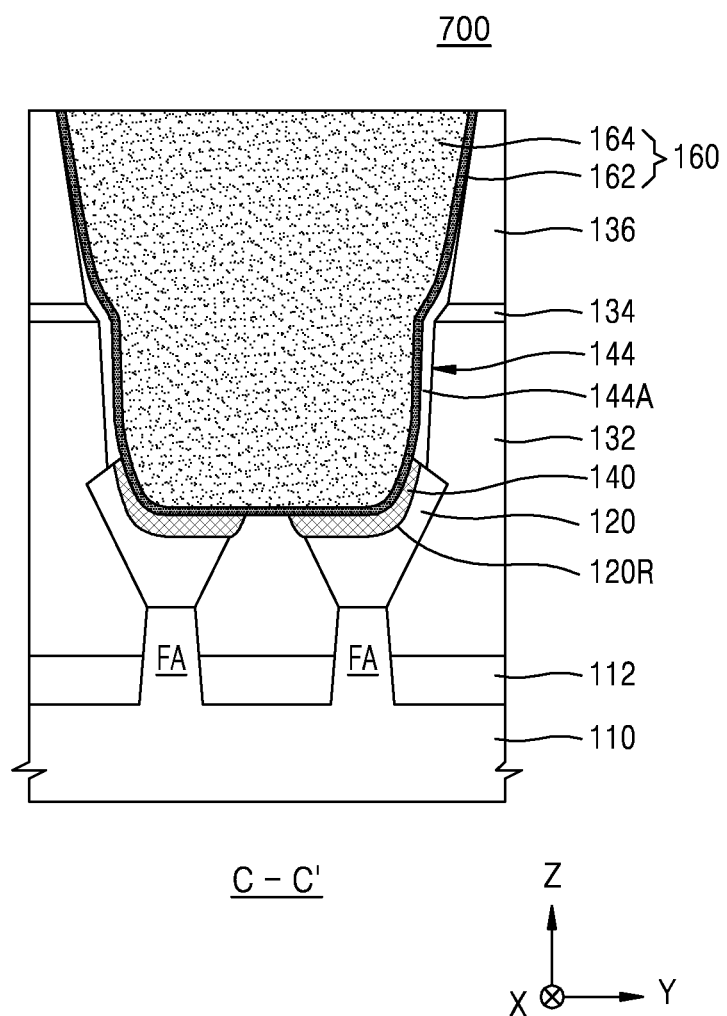

FIGS. 9A and 9B are diagrams for explaining an integrated circuit device according to yet other exemplary embodiments, FIG. 9A is a layout diagram of an integrated circuit device 700, and FIG. 9B is a cross-sectional view of the integrated circuit device 700 taken along a line C-C' of FIG. 9A. In FIGS. 9A and 9B, the same reference numerals as in FIGS. 1A to 1C denote the same members, and descriptions thereof will be omitted.

The integrated circuit device 700 shown in FIGS. 9A and 9B has mostly the same configuration as the integrated circuit device 100 described with reference to FIGS. 1A to 1C. However, the integrated circuit device 700 includes a plurality of fin-type active regions FA extending parallel to each other on the substrate 110. The plurality of gate lines GL extend parallel to each other in a direction (Y direction) intersecting with the plurality of fin-type active regions FA.

The source/drain region 120 is formed in each of the plurality of fin-type active regions FA at both sides of each of the plurality of gate lines GL.

The contact plug 160 extends in the second direction (Y direction) across two adjacent fin-type active regions FA out of the plurality of fin-type active regions FA. The contact plug 160 is formed on the source/drain regions 120 to be connected to each of the source/drain regions 120, the source/drain regions 120 being respectively formed in the two adjacent fin-type active regions FA.

The contact plug 160 extends from recessed regions 120R on top surfaces of the source/drain regions 120 in the third direction (Z direction) perpendicular to the main plane of the substrate 110. The contact plug 160 may penetrate the interlayer dielectric 136, the blocking insulating layer 134, and the inter-gate dielectric 132 and be electrically connected to the two adjacent source/drain regions 120.

The contact insulating spacer 144 is formed on the two adjacent source/drain regions 120 and surrounds the lower portion of the contact plug 160.

The contact plug 160 includes the conductive barrier layer 162 and the conductive plug 164, which are formed on the two adjacent source/drain regions 120 in this stated order. The metal silicide layer 140 is formed between the conductive barrier layer 162 and the two adjacent source/drain regions 120.

The integrated circuit device 700 shown in FIGS. 9A and 9B may have a configuration that is the same as or similar to the configuration shown in FIG. 1B, in a cross-sectional view taken along the extension direction (X direction) of the fin-type active regions FA.

In the integrated circuit device 700 shown in FIGS. 9A and 9B, although the contact plug 160 is shown as extending across the two source/drain regions 120 in the two fin-type active regions FA, the inventive concept is not limited thereto. For example, one contact plug 160 may extend across three or more fin-type active regions FA, as needed, and correspondingly, the one contact plug 160 may be electrically connected to three or more source/drain regions 120.

FIGS. 10A to 21B are cross-sectional views shown according to a process order in order to explain a method of fabricating an integrated circuit device, according to exemplary embodiments. More specifically, FIGS. 10A, 11A, ..., 21A are cross-sectional views of the integrated circuit device, which correspond to the cross-section taken along the line B-B' of FIG. 1A and are illustrated according to the process order. FIGS. 10B, 11B, ..., 21B are cross-sectional views of the integrated circuit device, which correspond to the cross-section taken along the line C-C' of FIG. 1A and are illustrated according to the process order. A method of fabricating the integrated circuit device 100 shown in FIGS. 1A to 1C will be described in detail with reference to FIGS. 10A to 21B. In FIGS. 10A to 21B, the same reference numerals as in FIGS. 1A to 1C denote the same members, and descriptions thereof will be omitted.

Figure 10A:
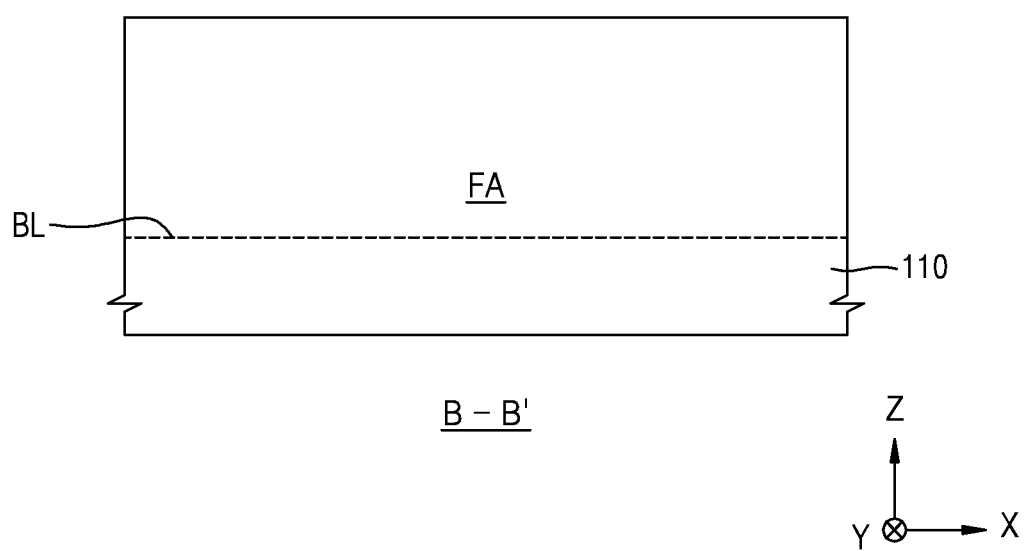
FIGS. 10A to 21B are cross-sectional views shown according to a process order in order to explain a method of fabricating an integrated circuit device, according to exemplary embodiments, FIGS. 10A, 11A, . . . , 21A are cross-sectional views of the integrated circuit device, which correspond to the cross-section taken along the line B-B' of FIG. 1A and are illustrated according to the process order, and FIGS. 10B, 11B, . . . , 21B are cross-sectional views of the integrated circuit device, which correspond to the cross-section taken along the line C-C' of FIG. 1A and are illustrated according to the process order.
Figure 10B:
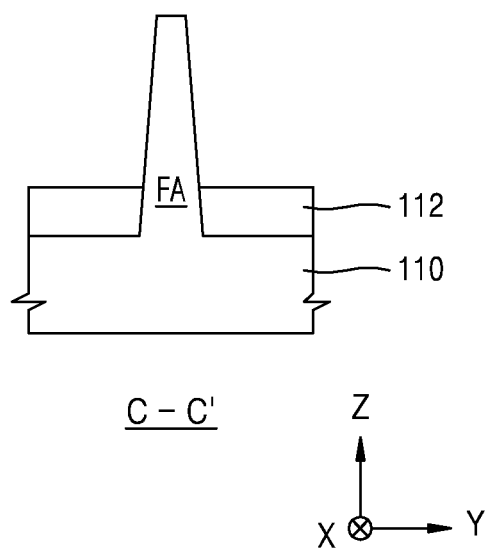

Referring to FIGS. 10A and 10B, a substrate 110 is prepared.

In some embodiments, the substrate 110 may have a certain metal oxide semiconductor (MOS) region. For example, the substrate 110 may have a PMOS region or an NMOS region.

A fin-type active region FA is formed by etching some regions of the substrate 110, the fin-type active region FA protruding upwards (Z direction) from a main plane (X-Y plane) of the substrate 110 and extending in one direction (X direction).

In some embodiments, a portion of the substrate 110, which is shown in FIGS. 10A and 10B, may be a region for forming one of a PMOS transistor and an NMOS transistor. The fin-type active region FA may include P-type or N-type impurity-diffused regions (not shown) depending upon a channel type of a MOS transistor intended to be formed in the fin-type active region FA.

An insulating layer is formed on the substrate 110 to cover the fin-type active region FA, followed by forming a device isolation layer 112 by performing etch-back of the insulating layer. The fin-type active region FA protrudes upwards from a top surface of the device isolation layer 112 to be exposed.

The device isolation layer 112 may include a silicon oxide layer, a silicon nitride layer, a silicon oxynitride layer, or combinations thereof. The device isolation layer 112 may include an insulating liner (not shown) including a thermal oxide layer, and a buried insulating layer (not shown) formed on the insulating liner.

Figure 11A:
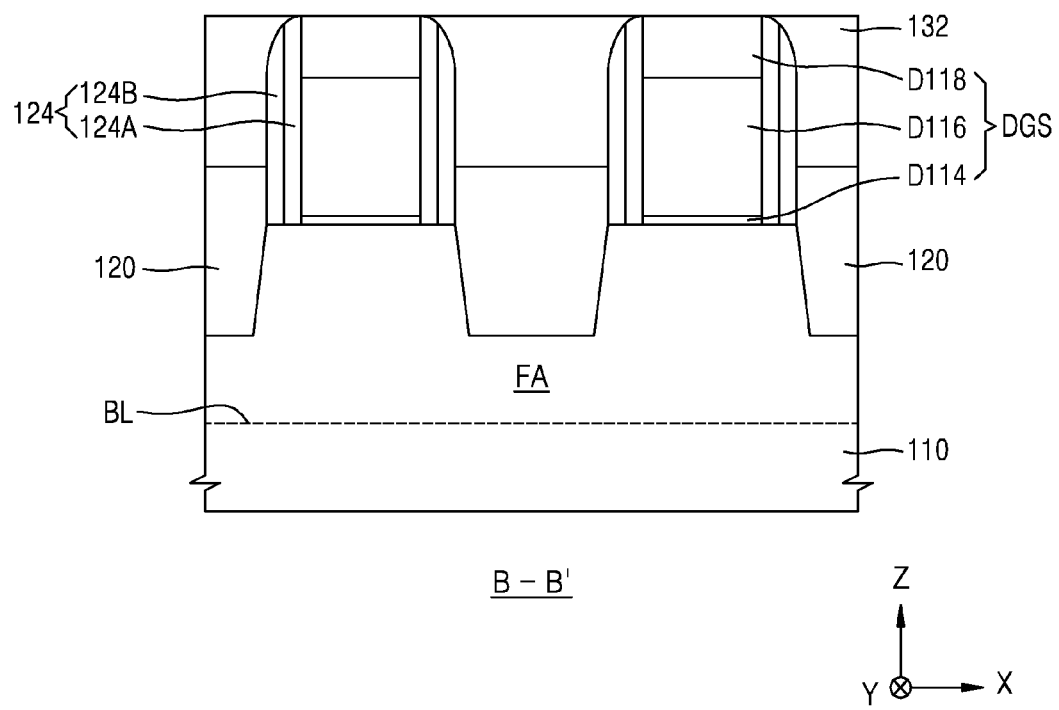
Figure 11B:
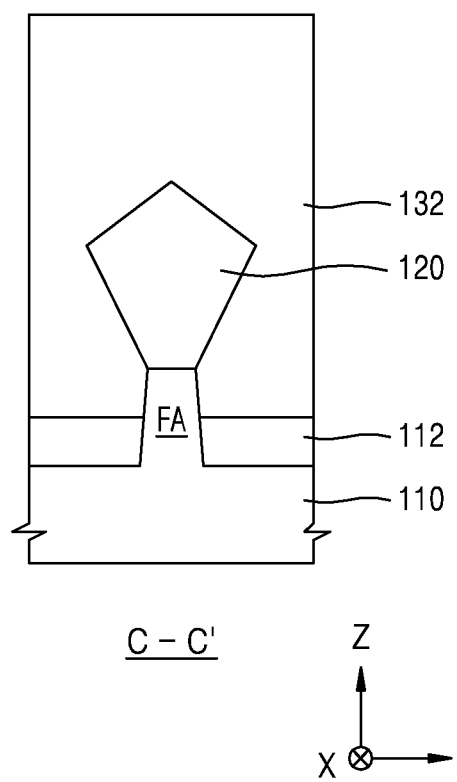

Referring to FIGS. 11A and 11B, a plurality of dummy gate structures DGS is formed on the fin-type active region FA and extends to intersect with the fin-type active region FA.

Each of the plurality of dummy gate structures DGS may include a dummy gate insulating layer D114, a dummy gate line D116, and a dummy gate capping layer D118, which are stacked on the fin-type active region FA in this stated order. In some embodiments, the dummy gate insulating layer D114 may include silicon oxide. The dummy gate line D116 may include polysilicon. The dummy gate capping layer D118 may include at least one of silicon oxide, silicon nitride, and silicon oxynitride.

Next, a gate insulating spacer 124 is formed on both sidewalls of each dummy gate structure DGS. The gate insulating spacer 124 may include a first carbon-containing insulating layer 124A and a silicon nitride layer 124B on the first carbon-containing insulating layer 124A, the first carbon-containing insulating layer 124A and the silicon nitride layer 124B covering the sidewalls of the dummy gate structures DGS.

In some embodiments, the first carbon-containing insulating layer 124A of the gate insulating spacer 124 may have a carbon content selected from a range of about 5 atom % to about 15 atom %. In some embodiments, the first carbon-containing insulating layer 124A may include SiCN, SiOCN, or combinations thereof. In one embodiment, the first carbon-containing insulating layer 124A may include a SiOCN layer having a carbon content selected from a range of about 5 atom % to about 15 atom %. The first carbon-containing insulating layer 124A may have a width of about 5 nm to about 20 nm.

To form the gate insulating spacer 124, an ALD or CVD process may be used. In particular, to form the first carbon-containing insulating layer 124A, a plasma enhanced ALD (PEALD) process may be used. A deposition process for forming the first carbon-containing insulating layer 124A may be performed at a relatively low temperature of about 600° C. or less. The deposition process for forming the first carbon-containing insulating layer 124A may be performed at a lower temperature of about 500° C. or less depending upon a kind of carbon precursor in use.

During an ALD process for forming the first carbon-containing insulating layer 124A, at least one selected from among a C1 to C10 alkane, a C2 to C10 alkene, a C1 to C15 alkylamine, a C4 to C15 nitrogen-containing heterocyclic compound, a C1 to C20 alkylsilane, a C1 to C20 alkoxysilane, and a C1 to C20 alkylsiloxane may be used as a carbon precursor.

The C1 to C10 alkane may include methane, ethane, propane, butane, pentane, hexane, heptane, octane, nonane, decane, or mixtures thereof.

The C2 to C10 alkene may include ethylene, propylene, butene, pentene, hexene, heptene, octene, nonene, decene, or mixtures thereof.

The C1 to C15 alkylamine may include monomethylamine, dimethylamine, trimethylamine, monoethylamine, diethylamine, triethylamine, monopropylamine, dipropylamine, tripropylamine, monobutylamine, dibutylamine, tributylamine, monopentylamine, dipentylamine, tripentylamine, monohexylamine, dihexylamine, monoheptylamine, diheptylamine, monooctylamine, monononylamine, monodecylamine, monoundecylamine, monododecylamine, monotridecylamine, monotetradecylamine, monopentadecylamine, dimethyl(ethyl)amine, dimethyl(propyl)amine, dimethyl(butyl)amine, dimethyl(pentyl)amine, dimethyl(hexyl)amine, dimethyl(heptyl)amine, dimethyl(octyl)amine, dimethyl(nonyl)amine, dimethyl(decyl)amine, dimethyl(undecyl)amine, dimethyl(dodecyl)amine, dimethyl(tridecyl)amine, diethyl(methyl)amine, diethyl(propyl)amine, diethyl(butyl)amine, diethyl(pentyl)amine, diethyl(hexyl)amine, diethyl(heptyl)amine, diethyl(octyl)amine, diethyl(nonyl)amine, diethyl(decyl)amine, diethyl(undecyl)amine, dipropyl(methyl)amine, dipropyl(ethyl)amine, dipropyl(butyl)amine, dipropyl(pentyl)amine, dipropyl(hexyl)amine, dipropyl(heptyl)amine, dipropyl(octyl)amine, dipropyl(nonyl)amine, dibutyl(methyl)amine, dibutyl(ethyl)amine, dibutyl(propyl)amine, dibutyl(pentyl)amine, dibutyl(hexyl)amine, dibutyl(heptyl)amine, dipentyl(methyl)amine, dipentyl(ethyl)amine, dipentyl(propyl)amine, dipentyl(butyl)amine, dihexyl(methyl)amine, dihexyl(ethyl)amine, dihexyl(propyl)amine, diheptyl(methyl)amine, dimethyl(butenyl)amine, dimethyl(pentenyl)amine, dimethyl(hexenyl)amine, dimethyl(heptenyl)amine, dimethyl(octenyl)amine, dimethyl(cyclopentyl)amine, dimethyl(cyclohexyl)amine, dimethyl(cycloheptyl)amine, bis(methyl cyclopentyl)amine, (dimethyl cyclopentyl)amine, bis(dimethyl cyclopentyl)amine, (ethyl cyclopentyl)amine, bis(ethylcyclopentyl)amine, (methylethyl cyclopentyl)amine, bis (methylethyl cyclopentyl)amine, N-methyl ethylenediamine, N-ethyl ethylenediamine, N-propyl ethylenediamine, N-butyl ethylenediamine, N-pentyl ethylenediamine, N-hexyl ethylenediamine, N-heptyl ethylenediamine, N-octyl ethylenediamine, N-nonyl ethylenediamine, N-decyl ethylenediamine, N-undecyl ethylenediamine, N-dodecyl ethylenediamine, or the like.

The C1 to C20 alkylsilane may include methylsilane, tetramethylsilane (TMS), tetraethylsilane (TES), tetrapropylsilane, tetrabutylsilane, dimethylsilane (DMS), diethylsilane (DES), dimethyldifluorosilane (DMDFS), dimethyldichlorosilane (DMDCS), diethyldichlorosilane (DEDCS), hexamethyldisilane, dodecamethylcyclohexasilane, dimethyldiphenylsilane, diethyldiphenylsilane, methyltrichlorosilane, methyltriphenylsilane, dimethyldiethylsilane, or the like.

The C1 to C20 alkoxysilane may include trimethoxysilane, dimethoxysilane, methoxysilane, methyldimethoxysilane, diethoxymethylsilane, dimethylethoxysilane, dimethylaminomethoxysilane, dimethylmethoxysilane, methyltrimethoxysilane, dimethyldimethoxysilane, phenyltrimethoxysilane, diphenyldimethoxysilane, diphenyldiethoxysilane, triphenylmethoxysilane, triphenylethoxysilane, or the like.

The C1 to C20 alkylsiloxane may include hexamethylcyclotrisiloxane, tetramethylcyclotetrasiloxane, tetraethylcyclotetrasiloxane, octamethylcyclotetrasiloxane, hexamethyldisiloxane, or the like.

During the ALD process for forming the first carbon-containing insulating layer 124A, an oxygen reactant may be used. The oxygen reactant may include $O_3$, $H_2O$, $O_2$, $NO_2$, NO, $N_2O$, $H_2O$, alcohol, a metal alkoxide, plasma $O_2$, remote plasma $O_2$, plasma $N_2O$, plasma $H_2O$, or combinations thereof.

During the ALD process for forming the first carbon-containing insulating layer 124A, a nitrogen reactant may be used. The nitrogen reactant may include $N_2$, $NH_3$, hydrazine ($N_2H_4$), plasma $N_2$, remote plasma $N_2$, or combinations thereof.

Next, a semiconductor layer is formed, by an epitaxial growth process, on the fin-type active region FA exposed on both sides of each dummy gate structure DGS, thereby forming a source/drain region 120. The source/drain region 120 may have a top surface that is at a higher level than a top surface of the fin-type active region FA.

Although the source/drain region 120 is shown in FIGS. 11A and 11B as having a specific cross-sectional shape, the cross-sectional shape of the source/drain region 120 according to the disclosed invention is not limited to the example shown in FIGS. 11A and 11B. For example, the cross-sectional shape of the source/drain region 120, which is cut along a Y-Z plane, may be a circular shape, an elliptical shape, or a polygonal shape such as a quadrangle, a pentagon, and a hexagon.

The source/drain region 120 may include an impurity-doped semiconductor layer. In some embodiments, the source/drain region 120 may include impurity-doped Si, SiGe, or SiC.

Next, the inter-gate dielectric 132 is formed to cover the source/drain region 120, the plurality of dummy gate structures DGS, and the gate insulating spacer 124.

In some embodiments, to form the inter-gate dielectric 132, an insulating layer may be formed to a sufficient thickness and cover the source/drain region 120, the plurality of dummy gate structures DGS, and the gate insulating spacer 124. Next, a result product including the insulating layer may be planarized to expose the plurality of dummy gate structures DGS, thereby forming the inter-gate dielectric 132 having a planarized top surface.

Figure 12A:
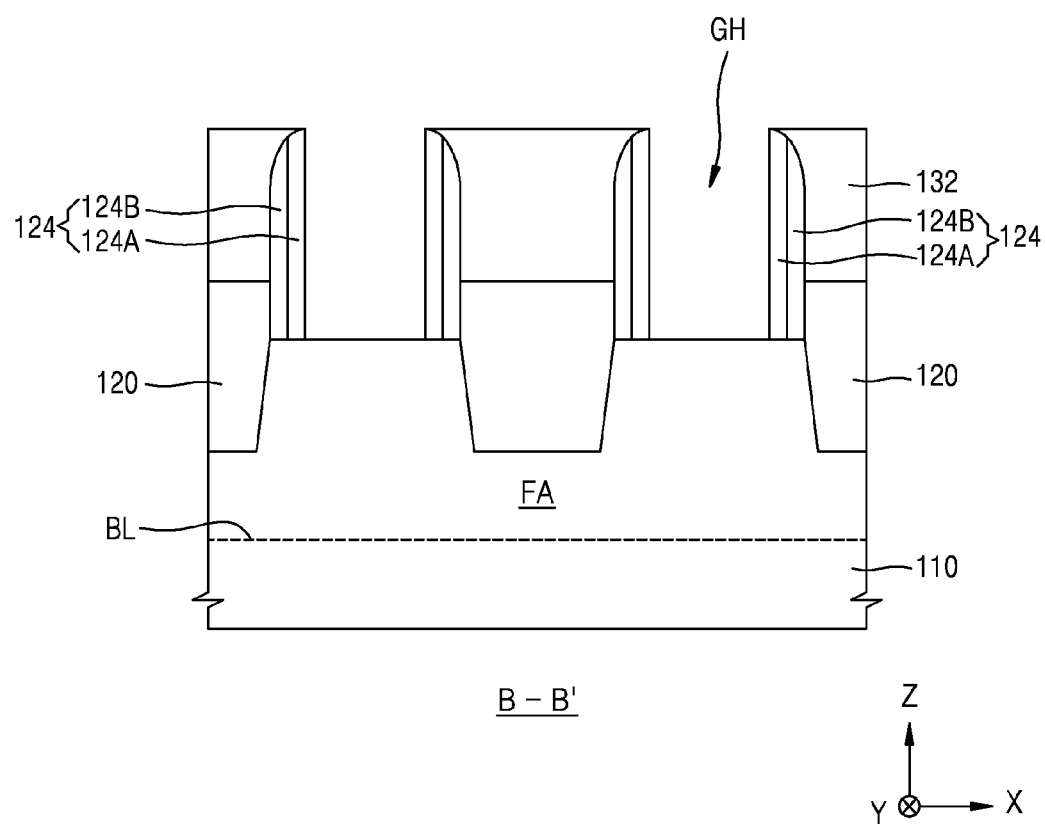
Figure 12B:
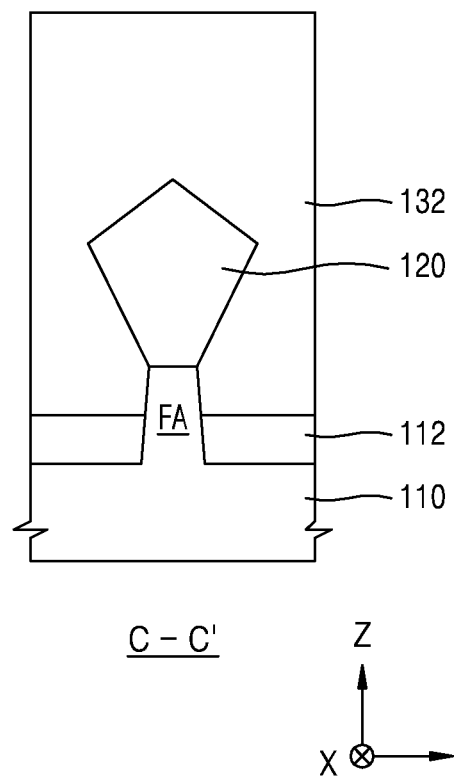

Referring to FIGS. 12A and 12B, the plurality of dummy gate structures DGS exposed by the inter-gate dielectric 132 are removed, thereby forming a plurality of gate spaces GH.

The gate insulating spacer 124 and the fin-type active region FA may be exposed by the plurality of gate spaces GH.

To remove the plurality of dummy gate structures DGS, a wet etching process may be used. For example, to perform the wet etching process, an etching solution including nitric acid (HNO₃), diluted fluoric acid (DHF), NH₄OH, tetramethylammonium hydroxide (TMAH), potassium hydroxide (KOH), or combinations thereof may be used, without being limited thereto.

While the wet etching process is performed to remove the plurality of dummy gate structures DGS, since the plurality of dummy gate structures DGS are removed by the etching solution, the first carbon-containing insulating layer 124A may be exposed to the etching solution. The first carbon-containing insulating layer 124A may have a relatively good resistance with respect to the etching solution used for removing the plurality of dummy gate structures DGS.

Figure 13A:
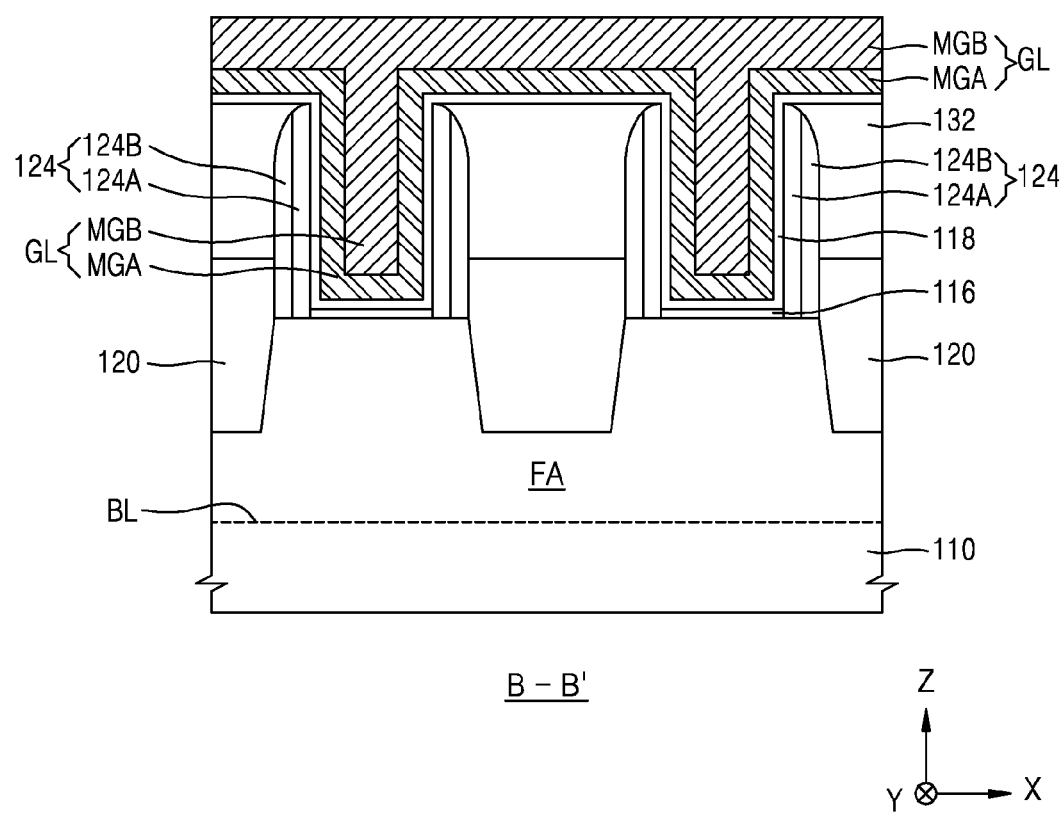
Figure 13B:
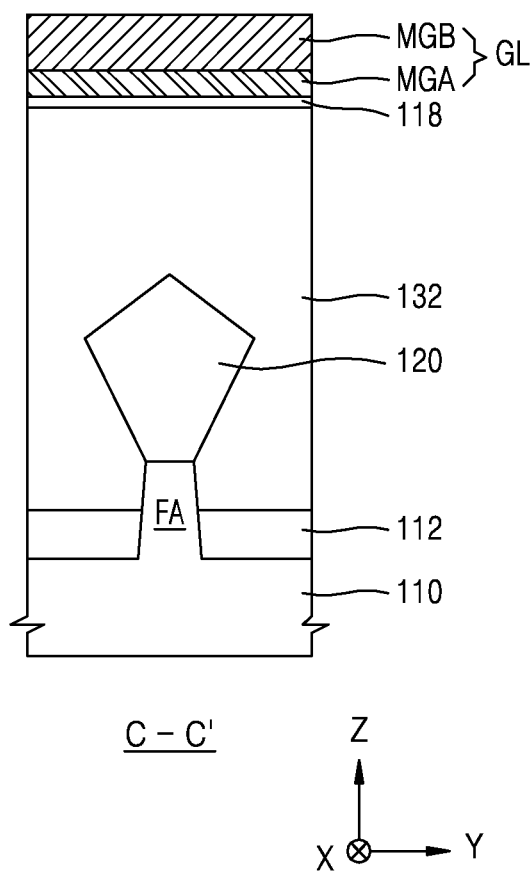

Referring to FIGS. 13A and 13B, a plurality of interface layers 116, a gate insulating layer 118, and a gate line GL are formed in this stated order so as to fill insides of the plurality of gate spaces GH (see FIGS. 12A and 12B).

A process of forming the plurality of interface layers 116 may include a process of oxidizing a portion of the fin-type active region FA, which is exposed in the plurality of gate spaces GH (see FIGS. 12A and 12B). The plurality of interface layers 116 may prevent an interface defect between a plurality of gate insulating layers 118 on the plurality of interface layers 116 and the underlying fin-type active region FA. In some embodiments, the plurality of interface layers 116 may include a silicon oxide layer, a silicon oxynitride layer, a silicate layer, or combinations thereof.

The gate insulating layer 118 and the gate line GL may be formed to cover a top surface of the inter-gate dielectric 132 while filling the insides of the plurality of gate spaces GH (see FIG. 12A).

The gate insulating layer 118 may include a silicon oxide layer, a high-K dielectric layer, or combinations thereof. The high-K dielectric layer may include a material having a greater dielectric constant than a silicon oxide layer. For example, the gate insulating layer 118 may have a dielectric constant of about 10 to about 25, but the disclosure is not limited thereto.

The gate line GL may include a first metal-containing layer MGA and a second metal-containing layer MGB. In some embodiments, each of the first metal-containing layer MGA and the second metal-containing layer MGB may be formed by an ALD, metal organic ALD (MOALD), or metal organic CVD (MOCVD) process, without being limited thereto.

Figure 14A:
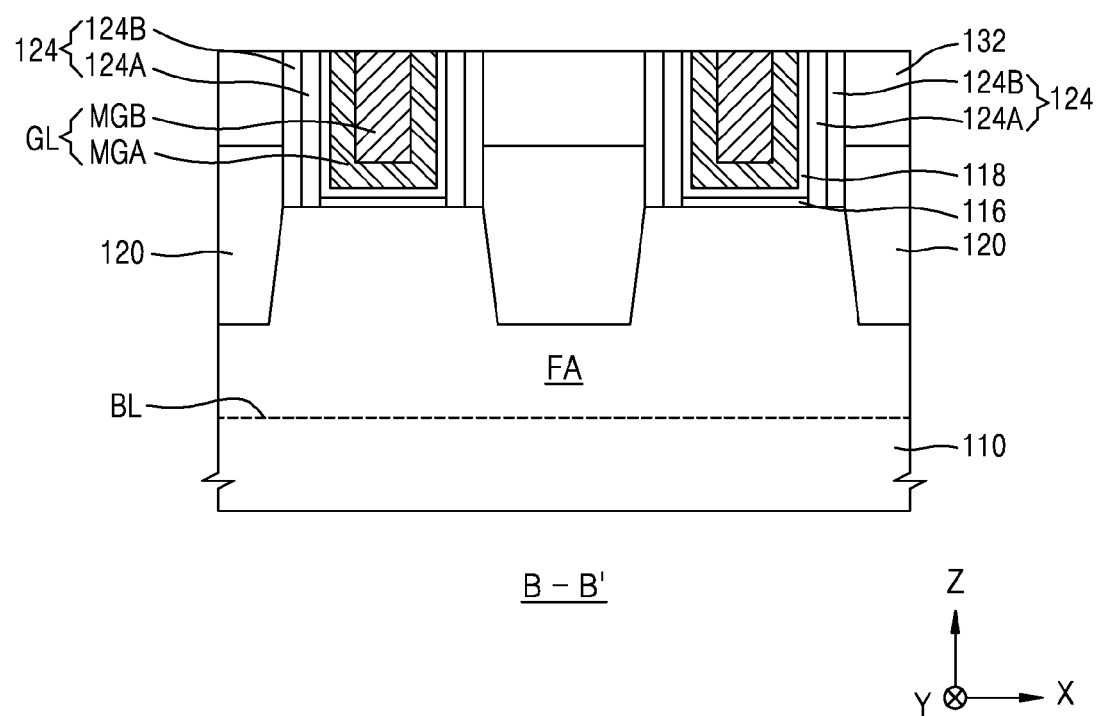
Figure 14B:
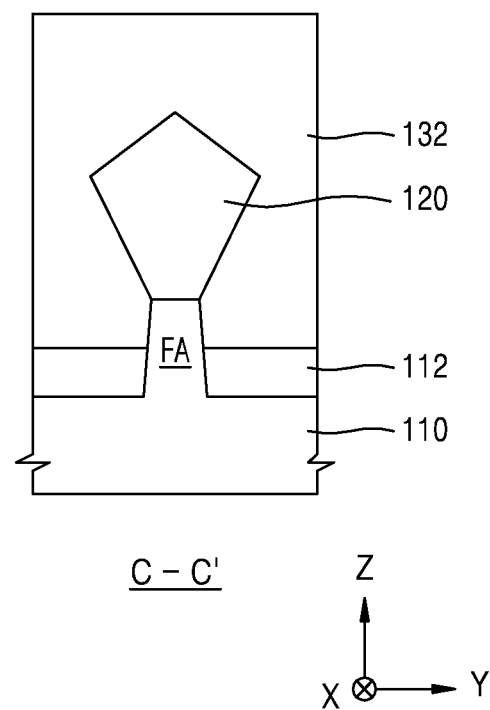

Referring to FIGS. 14A and 14B, unnecessary portions are removed by performing a planarization process for a result product of FIGS. 13A and 13B, whereby the gate line GL and the gate insulating layer 118 are respectively separated into a plurality of gate lines GL and a plurality of gate insulating layers 118, which remain in the plurality of gate spaces GH (see FIG. 12A).

As a result of the planarization process, the gate insulating spacer 124 and the inter-gate dielectric 132 are consumed from respective top surfaces thereof as much as a certain thickness, whereby Z-directional thicknesses, that is, vertical thicknesses of the gate insulating spacer 124 and the inter-gate dielectric 132 may be reduced, and top surfaces of the gate insulating layers 118, top surfaces of a plurality of gate insulating spacers 124, and a top surface of the inter-gate dielectric 132 may be exposed around top surfaces of the plurality of gate lines GL.

Figure 15A:
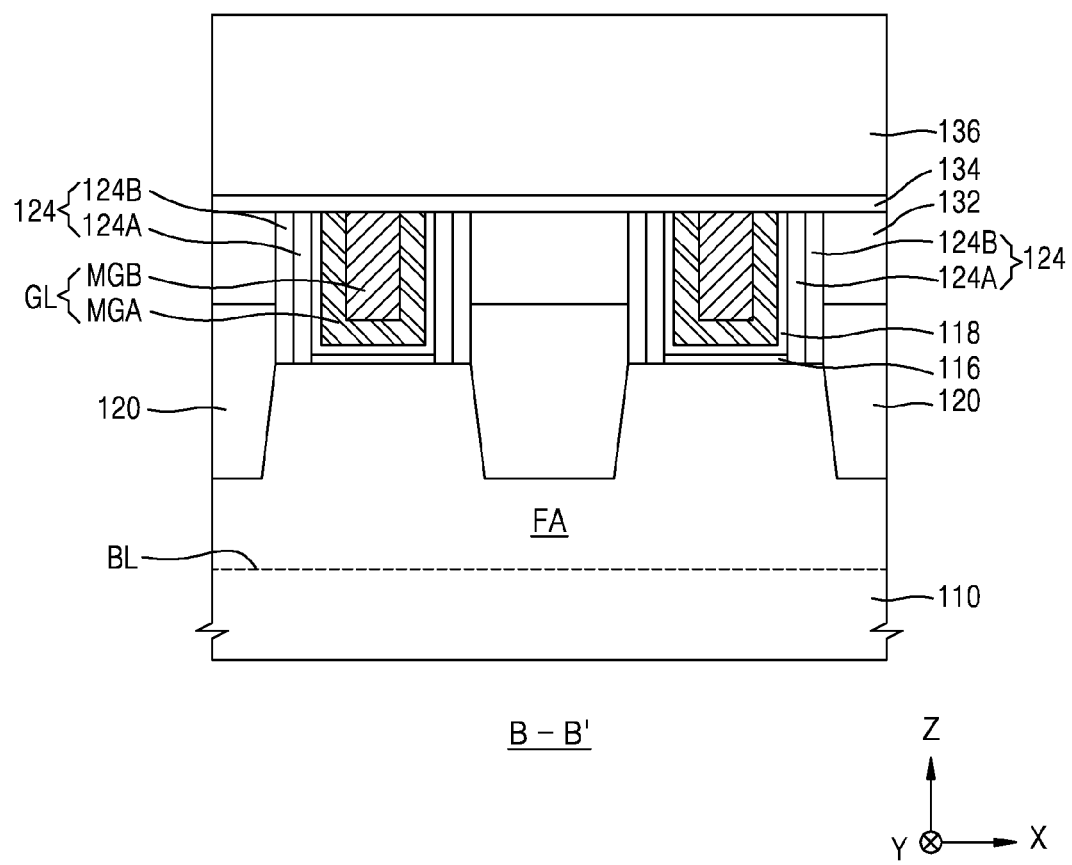
Figure 15B:
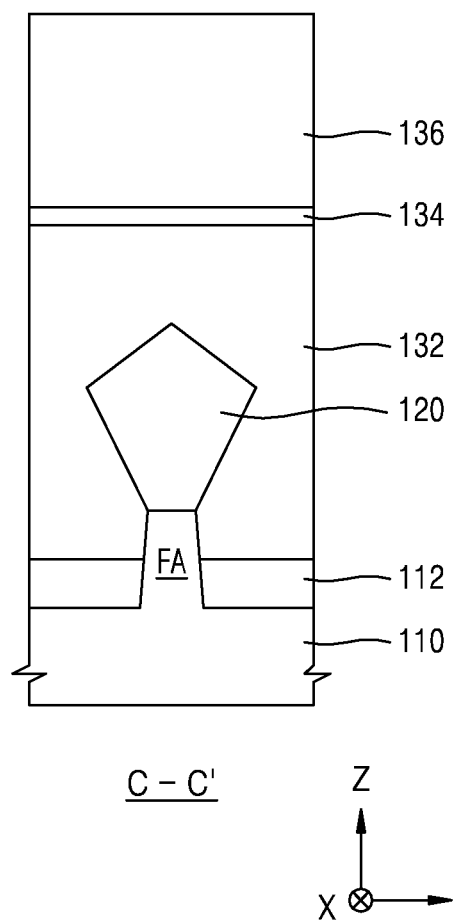

Referring to FIGS. 15A and 15B, a blocking insulating layer 134 and an interlayer dielectric 136 are formed, in this stated order, on the plurality of gate lines GL, the gate insulating spacer 124, and the gate insulating spacer 132.

The interlayer dielectric 136 may have a planarized top surface.

Although the blocking insulating layer 134 is shown as evenly covering the top surfaces of the plurality of gate lines GL in FIGS. 15A and 15B, the disclosure is not limited thereto. For example, the blocking insulating layer 134 may cover the top surfaces of the gate lines GL and at least a portion of both sidewalls of each gate line GL, and correspondingly, steps may be formed in at least some regions of the blocking insulating layer 134.

Figure 16A:
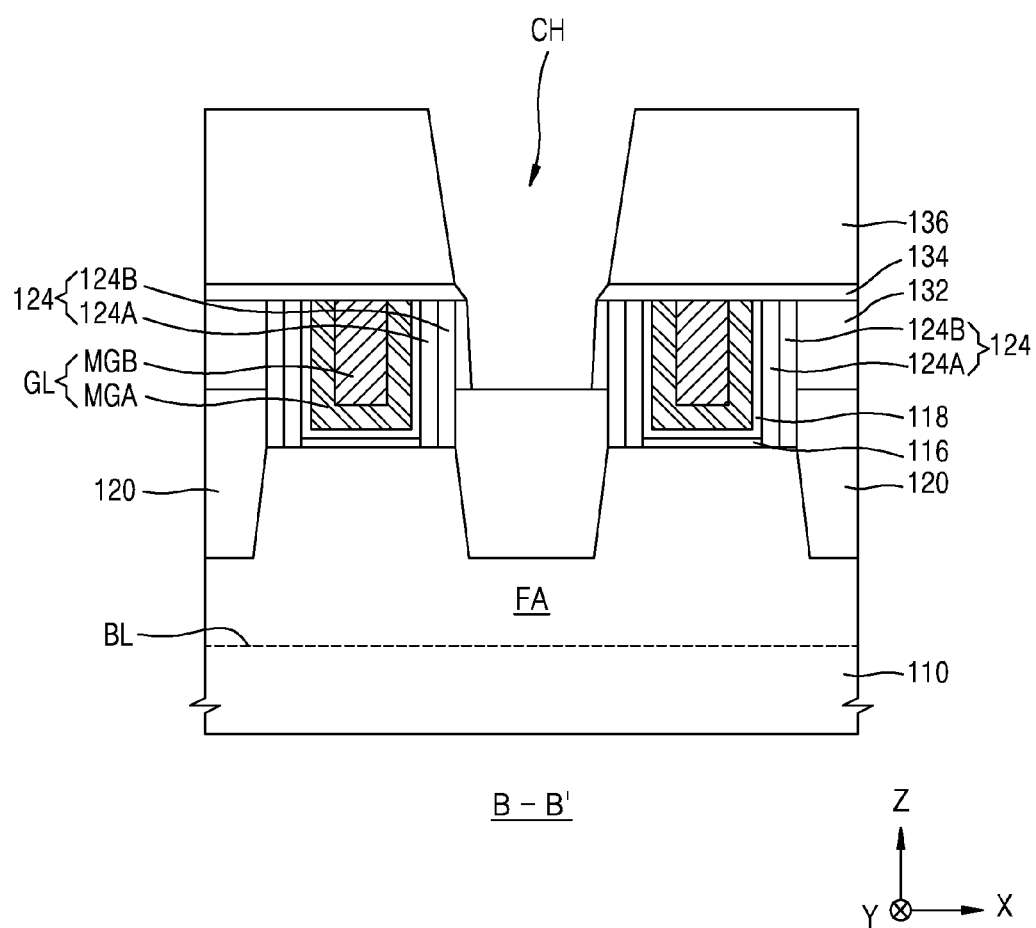
Figure 16B:
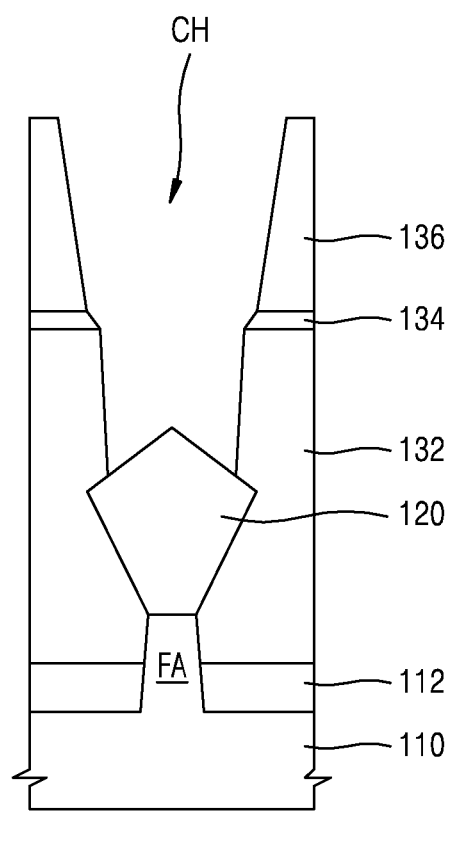

Referring to FIGS. 16A and 16B, a mask pattern (not shown) is formed on the interlayer dielectric 136, followed by etching the interlayer dielectric 136, the blocking insulating layer 134, and the inter-gate dielectric 132 in this stated order by using the mask pattern as an etch mask, thereby forming a contact hole CH penetrating the interlayer dielectric 136, the blocking insulating layer 134, and the inter-gate dielectric 132.

To form the contact hole CH, a dry etching process may be used.

In some embodiments, after the contact hole CH is formed, the source/drain region 120 may be exposed by the contact hole CH. In some other embodiments, unlike in the example shown in FIGS. 16A and 16B, when the contact hole CH is formed, the inter-gate insulating layer 132 may be exposed at a bottom surface of the contact hole CH by etching only a portion of the inter-gate insulating layer 132, and thus, the source/drain region 120 may not be exposed by the contact hole CH.

Figure 17A:
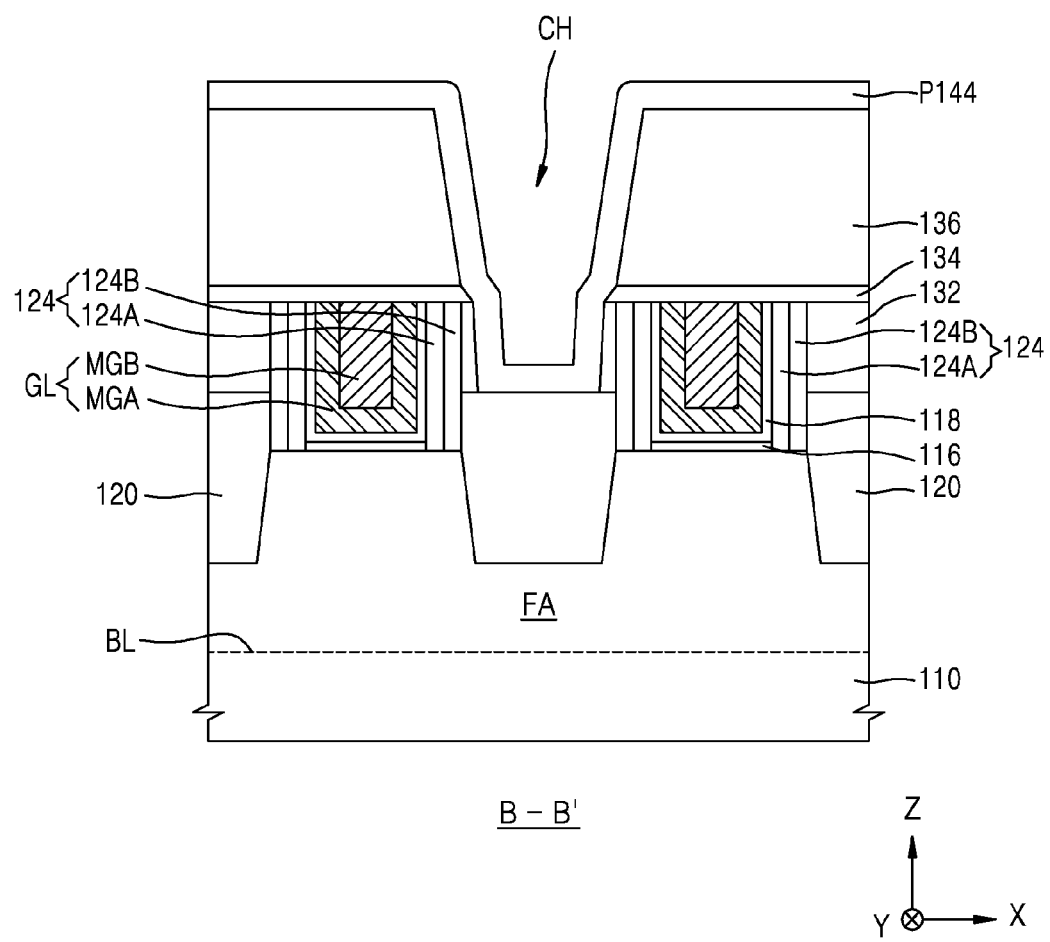
Figure 17B:
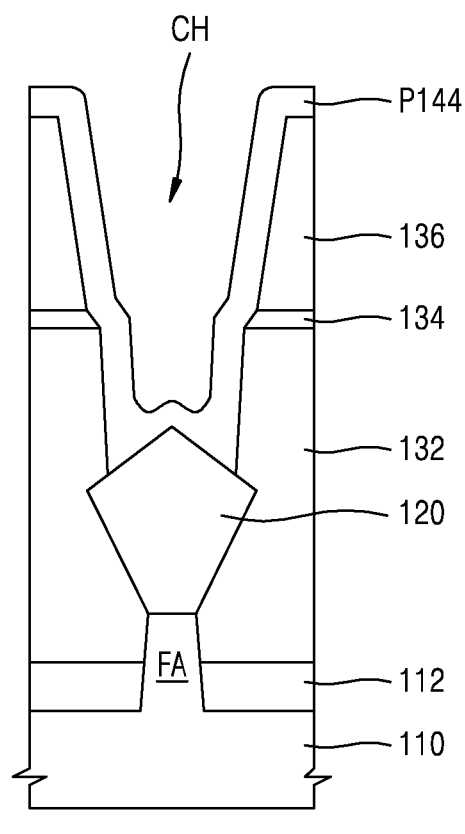

Referring to FIGS. 17A and 17B, a preliminary spacer layer P144 for forming a contact insulating spacer 144 in the contact hole CH is formed.

In some embodiments, the preliminary spacer layer P144 may have a carbon content that is greater than a carbon content of the first carbon-containing insulating layer 124A constituting the gate insulating spacer 124. For example, the preliminary spacer layer P144 may have a carbon content selected from a range of about 10 atom % to about 25 atom %.

In some embodiments, the preliminary spacer layer P144 may include SiCN, SiOCN, or combinations thereof. In one embodiment, the preliminary spacer layer P144 may include a SiOCN layer or a SiCN layer.

In some embodiments, to form the preliminary spacer layer P144, an ALD or CVD process may be used. Specifically, a PEALD process may be used to form the preliminary spacer layer P144. In some embodiments, a deposition process for forming the preliminary spacer layer P144 may be performed at a low temperature of about 450° C. or less. The deposition process for forming the preliminary spacer layer P144 may be performed at a temperature that is lower than a temperature at which the deposition process for forming the first carbon-containing insulating layer 124A described with reference to FIGS. 11A and 11B is performed. For example, the deposition process for forming the preliminary spacer layer P144 may be performed at a temperature of about 400° C. to about 450° C., and the deposition process for forming the first carbon-containing insulating layer 124A may be performed at a temperature of about 600° C. to about 650° C.

In some embodiments, in the deposition process for forming the preliminary spacer layer P144, different precursors may be separately used as a silicon precursor and a carbon precursor. In this case, materials capable of being respectively used as the silicon precursor and the carbon precursor are mostly the same as the exemplary materials described with reference to FIGS. 11A and 11B as to the formation of the first carbon-containing insulating layer 124A.

In some other embodiments, in the deposition process for forming the preliminary spacer layer P144, a precursor, which includes a compound including both of a silicon atom and a carbon atom, may be used instead of respectively using separate precursors as the silicon precursor and the carbon precursor.

In the deposition process for forming the preliminary spacer layer P144, an oxygen reactant and/or a nitrogen reactant may be used, as needed. Examples of the oxygen reactant and the nitrogen reactant are the same as the examples described with reference to FIGS. 11A and 11B as to the formation of the first carbon-containing insulating layer 124A.

In some embodiments, the preliminary spacer layer P144 may have a thickness of about 5 nm to about 25 nm, without being limited thereto.

Figure 18A:
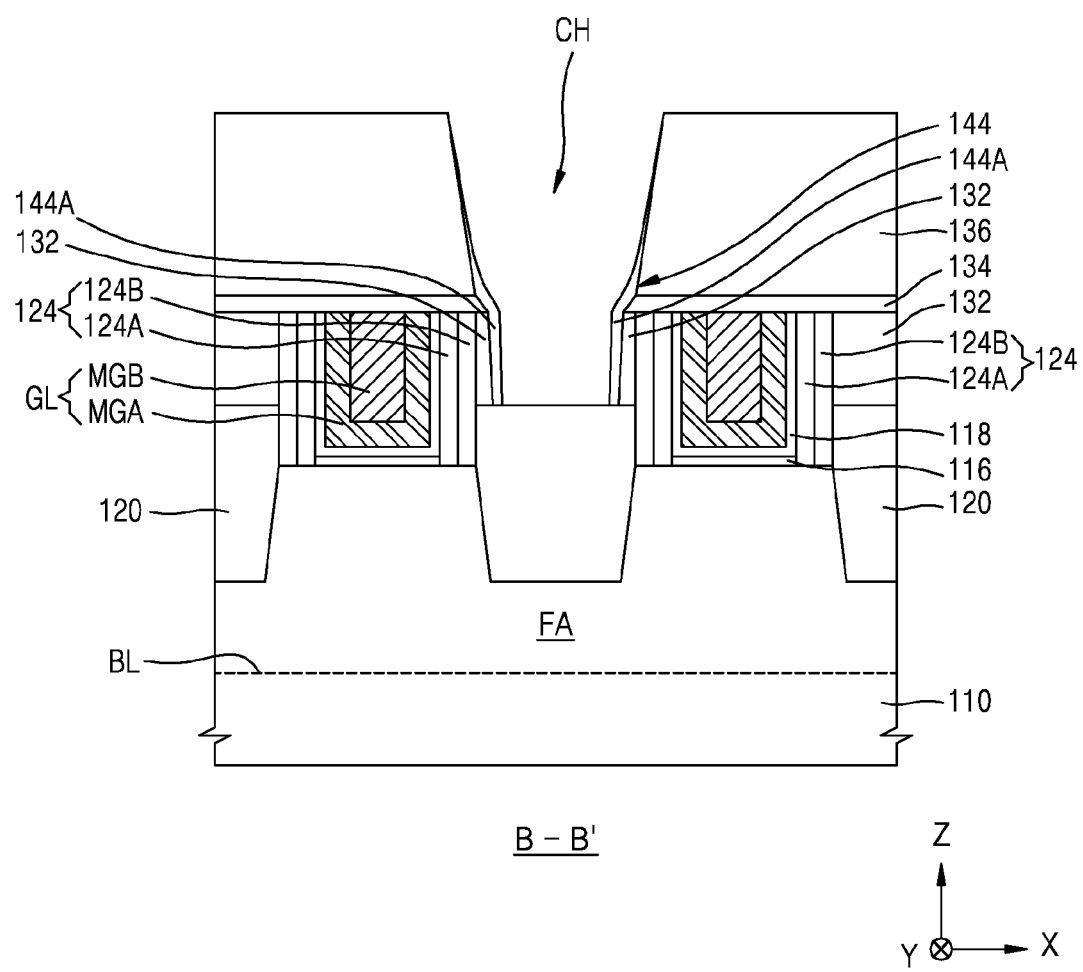
Figure 18B:
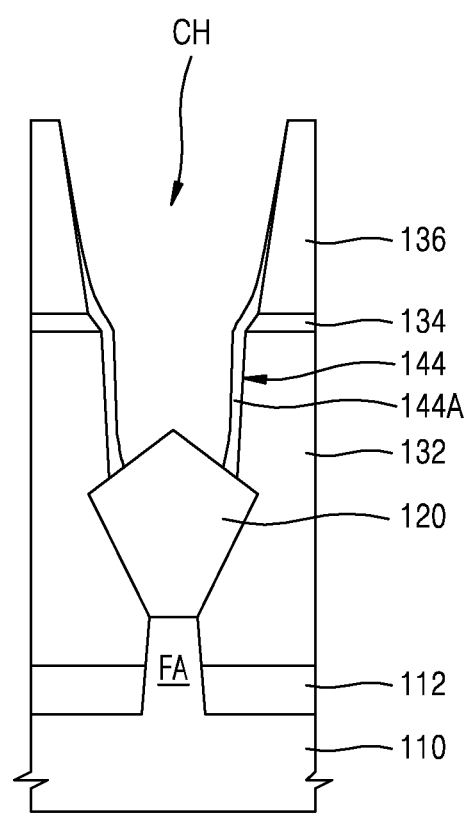

Referring to FIGS. 18A and 18B, the preliminary spacer layer P144 is subjected to etch-back, thereby forming a contact insulating spacer 144 on a sidewall of the contact hole CH, the contact insulating spacer 144 including a second carbon-containing insulating layer 144A.

In some embodiments, the second carbon-containing insulating layer 144A obtained after the etch-back of the preliminary spacer layer P144 may have a width of about 1 nm to about 5 nm.

As described with reference to FIGS. 16A and 16B, after the formation of the contact hole CH, when the source/drain region 120 is covered with the inter-gate insulating layer 132 and is not exposed at the bottom surface of the contact hole CH, an etch-back process for forming the contact insulating spacer 144 is formed as described with reference to FIGS. 18A and 18B, and then, the inter-gate insulating layer 132 remaining on the source/drain region 120 in the contact hole CH may be removed by a wet etching process until the source/drain region 120 is exposed at the bottom surface of the contact hole CH. Here, since the second carbon-containing insulating layer 144A has a dense structure having a relatively high carbon content, during the wet etching process for removing the inter-gate insulating layer 132 remaining in the contact hole CH, the consumption of the second carbon-containing insulating layer 144A may be minimized due to excellent etch resistance of the second carbon-containing insulating layer 144A with respect to an etch solution. Thus, during the wet etching process for removing the inter-gate insulating layer 132 remaining in the contact hole CH, even though the second carbon-containing insulating layer 144A of the contact insulating spacer 144 is exposed to the etch solution, the second carbon-containing insulating layer 144A may remain on the sidewall of the contact hole CH without the substantial consumption of the second carbon-containing insulating layer 144A while the inter-gate insulating layer 132 remaining in the contact hole CH is removed until the source/drain region 120 is exposed. Therefore, there is no concern that the etch solution penetrate up to the inter-gate insulating layer 132 along the sidewall of the contact hole CH, and the occurrence of a short circuit or leakage currents due to such a problem can be suppressed.

Figure 19A:
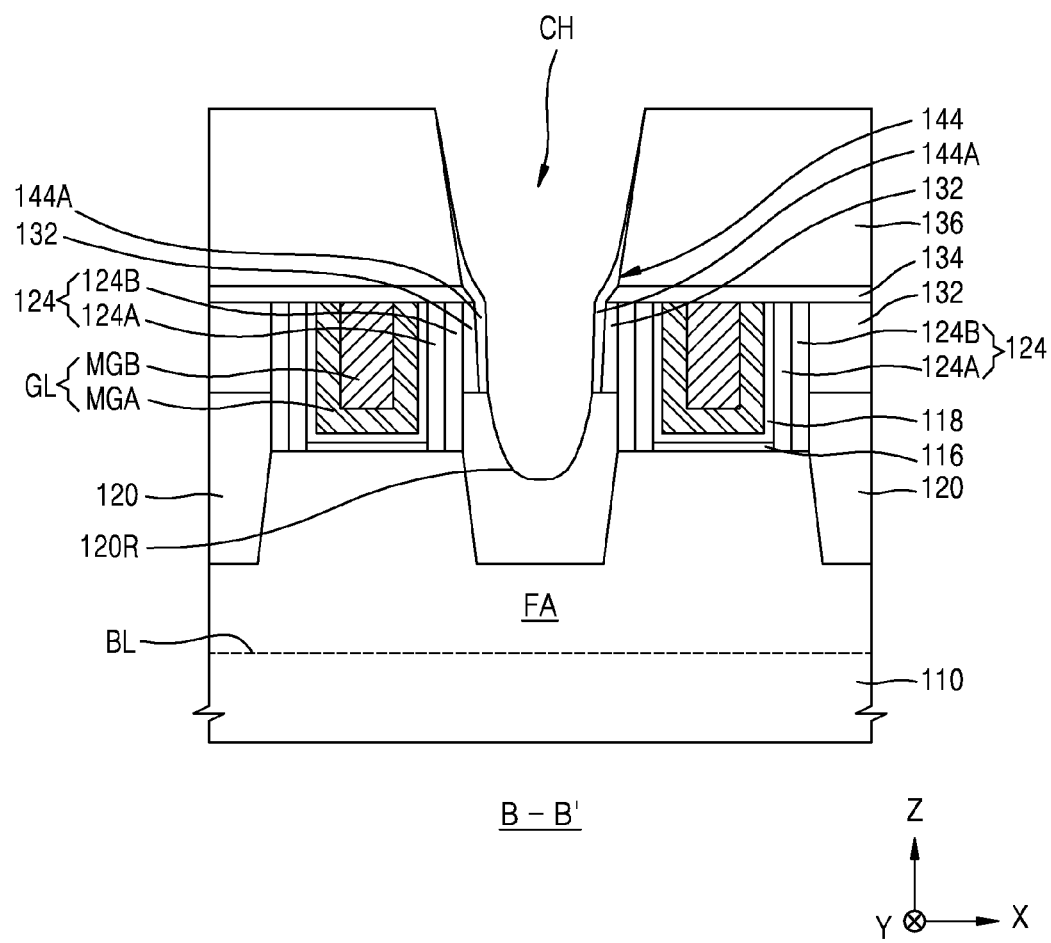
Figure 19B:
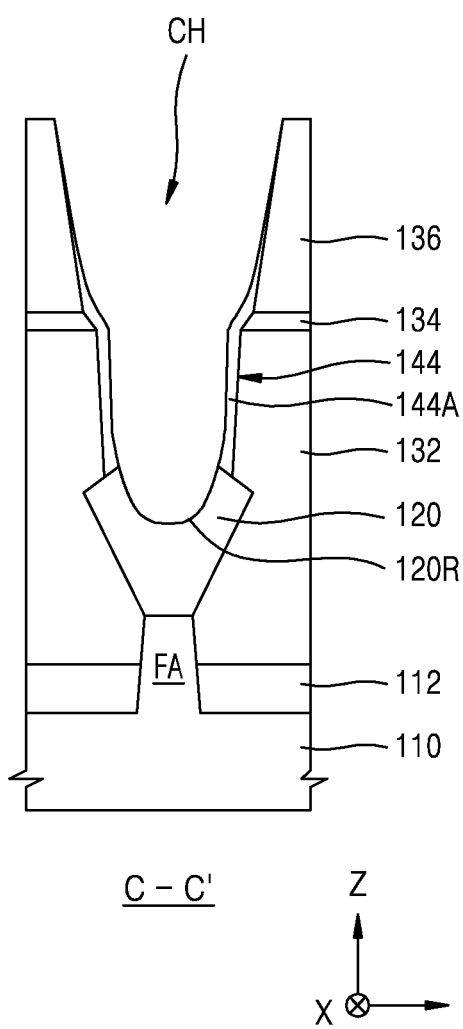

Referring to FIGS. 19A and 19B, a portion of the source/drain region 120 exposed by the contact hole CH is removed, thereby forming a recessed region 120R on the top surface of the source/drain region 120.

The recessed region 120R may be formed to communicate with the contact hole CH. In the formation of the recessed region 120R, a depth of the recessed region 120R may be determined such that the recessed region 120R has a bottom surface that is at a lower level than the top surface of the fin-type active region FA.

Figure 20A:
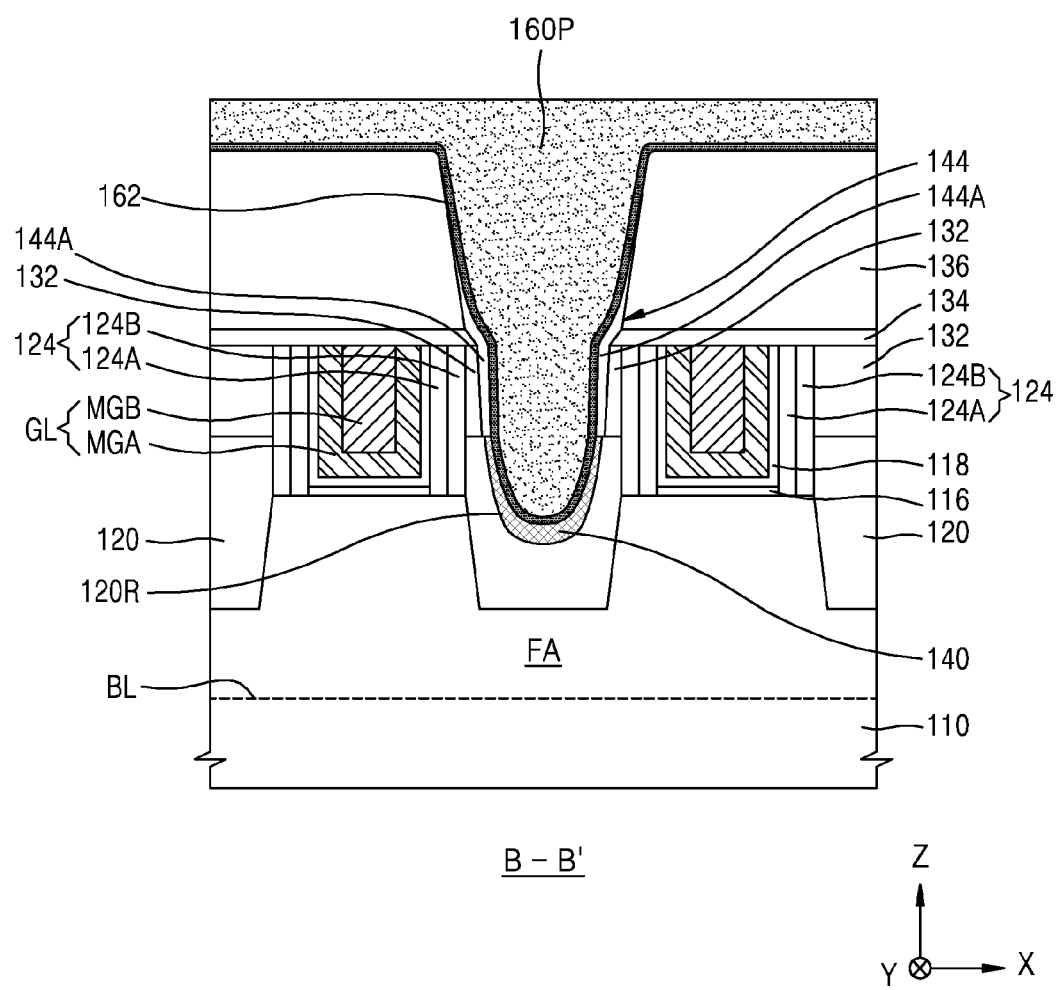
Figure 20B:
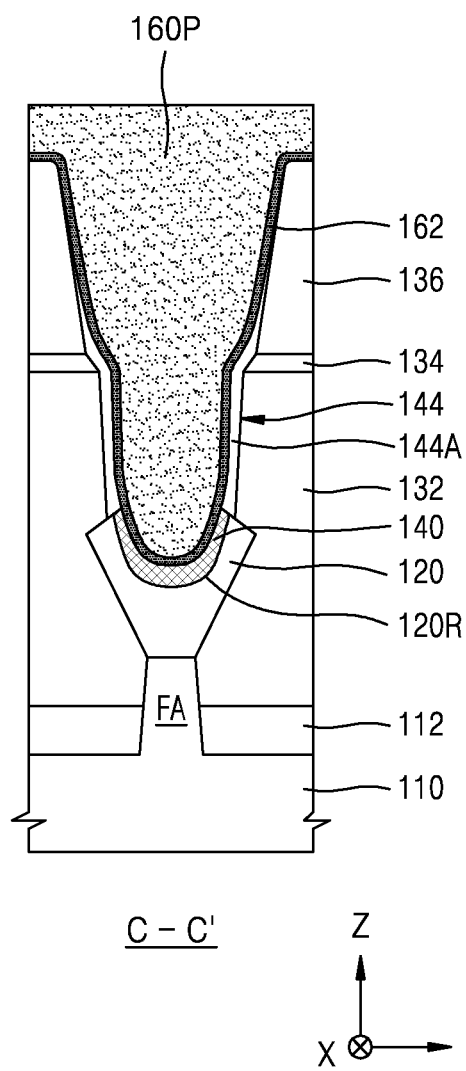

Referring to FIGS. 20A and 20B, a metal silicide layer 140 is formed on a surface of the source/drain region 120 in the recessed region 120R, a conductive barrier layer 162 is formed on the metal silicide layer 140 and covers the contact insulating spacer 144 exposed in the contact hole CH (see FIGS. 19A and 19B), and a conductive layer 160P is formed on the conductive barrier layer 162 and fills the contact hole CH.

In some embodiments, the conductive layer 160P may include W, Cu, Al, alloys thereof, or combinations thereof.

The conductive layer 160P may be formed to cover the conductive barrier layer 162 on a top surface of the inter-layer dielectric 136 while filling insides of the contact hole CH and the recessed region 120R.

In some embodiments, to form the metal silicide layer 140 and the conductive barrier layer 162, the following processes may be performed. First, a portion of the source/drain region 120 may be subjected to amorphization by implanting amorphization elemental ions into the source/drain region 120 through the recessed region 120R exposed by the contact hole CH, thereby forming an amorphous semiconductor region. The amorphization elemental ions may include a dopant selected from among Ge, Si, C, Ar, Kr, Xe, and combinations thereof. Next, a metal layer may be formed to cover the source/drain region 120 in the recessed region 120R. The metal layer may include Ti, W, Ru, Nb, Mo, Hf, Ni, Co, Pt, Yb, Tb, Dy, Er, Pd, or combinations thereof. Next, the conductive barrier layer 162 may be formed to cover an exposed surface of the metal layer and an inner wall of the contact hole CH. The conductive barrier layer 162 may include a conductive metal nitride layer. For example, the conductive barrier layer 162 may include TiN, TaN, AlN, WN, or combinations thereof. The conductive barrier layer 162 may be formed by a PVD, CVD, or ALD process. Next, a reaction between a semiconductor material constituting the source/drain region 120 and a metal constituting the metal layer may be induced by performing a thermal treatment of a result product including the metal layer and the conductive barrier layer 162, thereby forming the metal silicide layer 140 to cover the source/drain region 120 in the recessed region 120R. In the formation of the metal silicide layer 140, the amorphous semiconductor region locally formed in the source/drain region 120 may react with the metal layer.

In some embodiments, after the formation of the metal silicide layer 140, the metal layer may partially remain between the metal silicide layer 140 and the conductive barrier layer 162. In some other embodiments, the metal layer is fully used for forming the metal silicide layer 140 during the formation of the metal silicide layer 140, whereby the metal layer may not remain between the metal silicide layer 140 and the conductive barrier layer 162. In this case, as shown in FIGS. 20A and 20B, the metal silicide layer 140 and the conductive barrier layer 162 may contact each other.

The conductive layer 160P may be formed by depositing a metal onto a result product including the metal silicide layer 140 and the conductive barrier layer 162 to a sufficient thickness to fill the contact hole CH and the recessed region 120R.

Figure 21A:
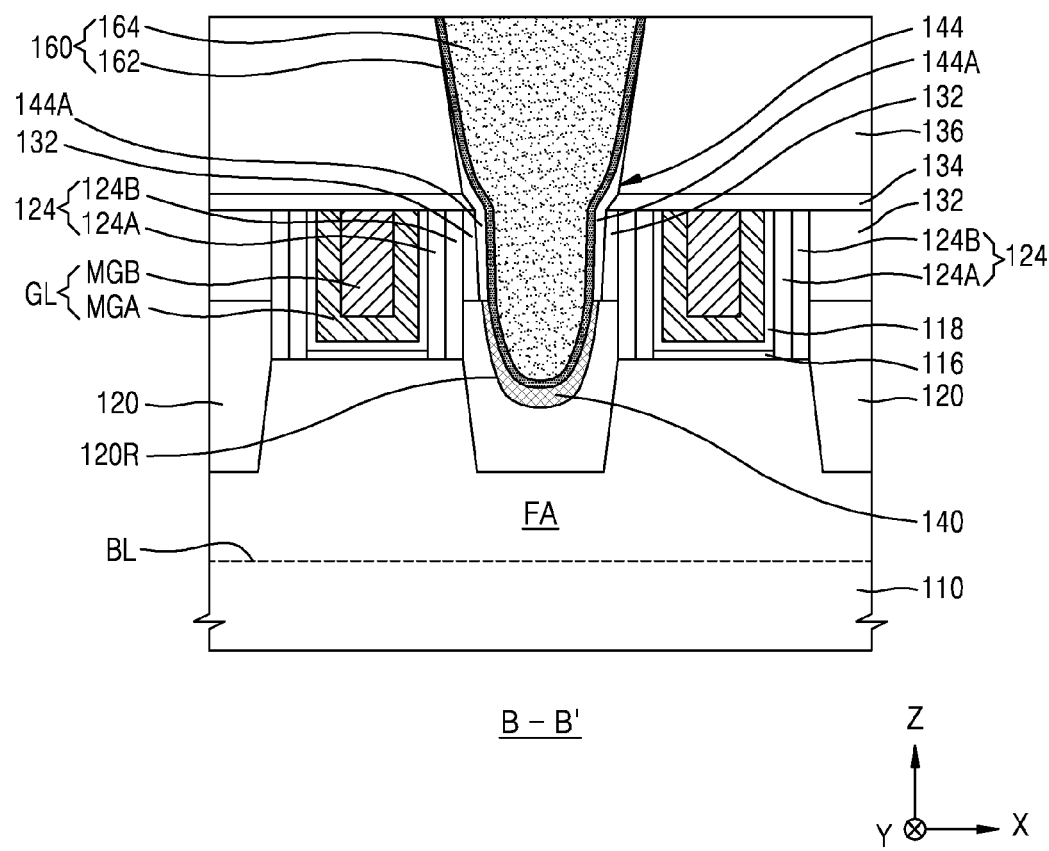
Figure 21B:
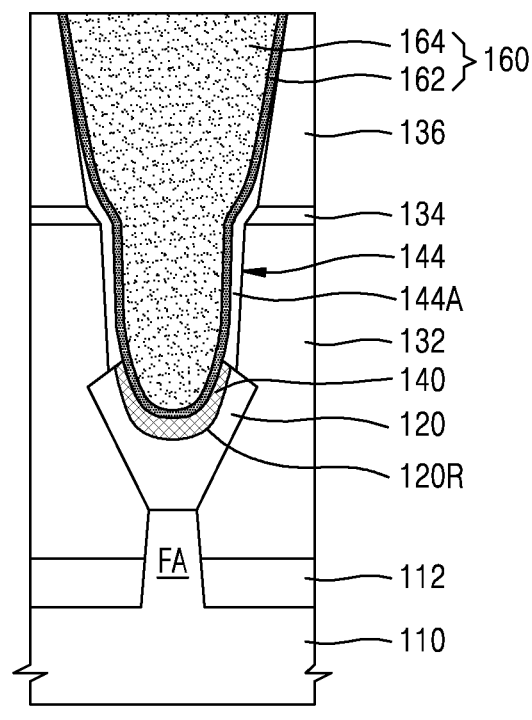

Referring to FIGS. 21A and 21B, unnecessary portions of the conductive barrier layer 162 and the conductive layer 160P are removed until the top surface of the interlayer dielectric 136, whereby the conductive barrier layer 162 and the conductive layer 160P may remain only inside the contact hole CH and the recessed region 120R. As a result, a contact plug 160 including a conductive plug 164 and the conductive barrier layer 162 in the contact hole CH may be obtained, the conductive plug 164 being a portion of the conductive layer 160P, which fills the insides of the contact hole CH and the recessed region 120R, and the conductive barrier layer 162 in the contact hole CH surrounding the conductive plug 164.

To remove the unnecessary portions of the conductive barrier layer 162 and the conductive layer 160P, a planarization process such as a chemical mechanical polishing (CMP) process or the like may be performed.

As a result of the above method, an integrated circuit device may be provided that includes the various components and features described in the various embodiments.

Heretofore, although the method of fabricating the integrated circuit device 100 shown in FIGS. 1A to 1C has been described, it will be understood by those skilled in the art that the integrated circuit devices 200, 300, 400, 500, 600, and 700 according to the inventive concept and various integrated circuit devices modified and changed therefrom may be fabricated by variously modifying and changing the method described with reference to FIGS. 10A to 21B without departing from the spirit and scope of the inventive concept.

In particular, to fabricate the integrated circuit device 200 shown in FIGS. 3A and 3B, $CF_4$ gas and $O_2$ gas may be used during the etch-back of the preliminary spacer layer P144 described with reference to FIGS. 18A and 18B. Here, the $CF_4$ gas is used as an etch gas, and the $O_2$ gas may activate fluorine (F) radicals. During the etch-back of the preliminary spacer layer P144, F ions or F-containing materials may remain in more amounts on an exposed surface of the contact insulating spacer 144 in the vicinity of the bottom surface of the contact hole CH than in other portions of the contact hole CH. As a result, the preliminary spacer layer P144 in the vicinity of the bottom surface of the contact hole CH may be more etched than other portions of the preliminary spacer layer P144. As a result, as shown in FIGS. 3A and 3B, the width W1 of the bottom surface of the second carbon-containing insulating layer 244A may be less than the maximum width of the middle portion of the second carbon-containing insulating layer 244A, the bottom surface of the second carbon-containing insulating layer 244A being closest to the substrate 110.

To fabricate the integrated circuit device 300 shown in FIGS. 4A and 4B, in the stage of forming the contact insulating spacer 144 described with reference to FIGS. 18A and 18B, instead of the contact insulating spacer 144, the silicon nitride layer 344A and the second carbon-containing insulating layer 344B may be formed in this stated order, thereby forming the contact insulating spacer 344 having a double-layer structure.

To fabricate the integrated circuit device 400 shown in FIGS. 6A and 6B, in the stage of forming the contact insulating spacer 144 described with reference to FIGS. 18A and 18B, instead of the contact insulating spacer 144, the contact insulating spacer 444, which includes the second carbon-containing insulating layer 444A including the uneven structure 444P, may be formed.

To form the second carbon-containing insulating layer 444A including the uneven structure 444P, during the etch-back of the preliminary spacer layer P144 described with reference to FIGS. 18A and 18B, $CH_4$ gas and $O_2$ gas may be used. Here, a flow rate of each of the $CH_4$ gas and the $O_2$ gas may be controlled according to a similar manner to the manner described as to the method of fabricating the integrated circuit device 200 shown in FIGS. 3A and 3B, whereby the shape and unevenness size of the uneven structure 444P formed in the second carbon-containing insulating layer 444A may be controlled.

To fabricate the integrated circuit device 500 shown in FIGS. 7A and 7B, the manner as described as to the method of fabricating the integrated circuit device 400 shown in FIGS. 6A and 6B may be used. For example, in order that at least a portion of the second carbon-containing insulating layer 544A intermittently extends along the extension direction (Z direction) of the contact plug 560, when the preliminary spacer layer P144 shown in FIGS. 17A and 17B is subjected to etch-back by the method as described with reference to FIGS. 18A and 18B, $CH_4$ gas and $O_2$ gas may be used, and the second carbon-containing insulating layer 544A having a desired shape may be formed by controlling a flow rate of each of the $CH_4$ gas and the $O_2$ gas.

To fabricate the integrated circuit device 600 shown in FIG. 8, when the preliminary spacer layer P144 shown in FIGS. 17A and 17B is subjected to etch-back by the method as described with reference to FIGS. 18A and 18B, $CH_4$ gas and $O_2$ gas may be used, and a manner, by which different amounts of the $CH_4$ gas and the $O_2$ gas contribute to the etch-back of the preliminary spacer layer P144 depending upon the widths CW1 and CW2 of the contact hole CH, may be used.

Although the integrated circuit devices including FinFETs having 3-dimensional-structured channels and the fabrication methods thereof have been described with reference to FIGS. 1A to 21B, the inventive concept is not limited thereto. For example, it will be understood by those skilled in the art that integrated circuit devices including planar MOSFETs having the features according to the inventive concept and fabrication methods thereof may be provided by various modifications and changes of the inventive concept without departing from the spirit and scope of the inventive concept.

Figure 22:
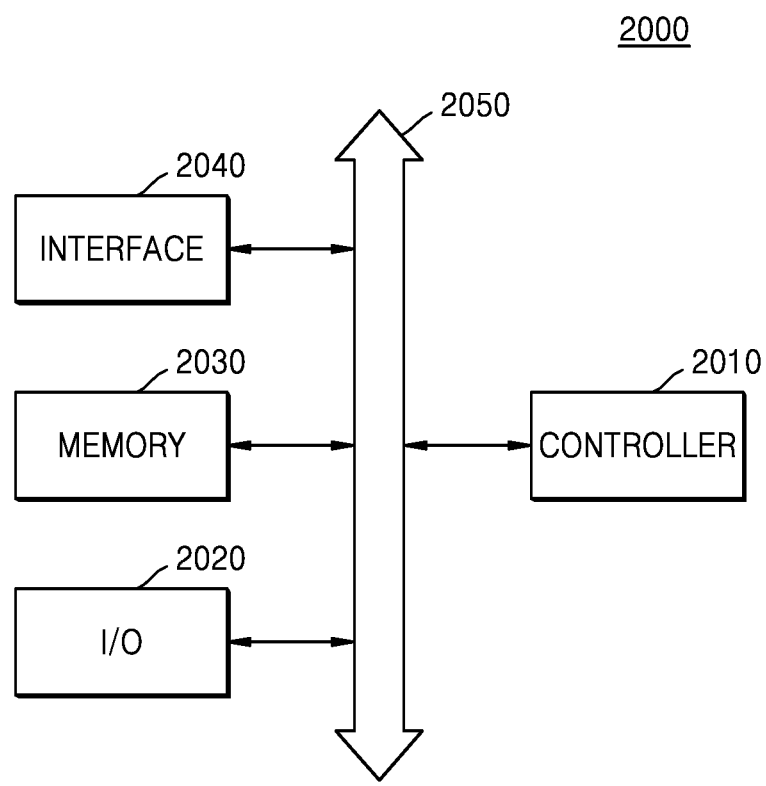
FIG. 22 is a block diagram of an electronic system according to exemplary embodiments.

FIG. 22 is a block diagram of an electronic system 2000 according to exemplary embodiments.

The electronic system 2000 includes a controller 2010, an input/output (I/O) device 2020, a memory 2030, and an interface 2040, and these components are connected to each other through a bus 2050.

The controller 2010 may include at least one of a microprocessor, a digital signal processor, and processors similar thereto. The input/output device 2020 may include at least one of a keypad, a keyboard, and a display. The memory 2030 may be used for storing a command executed by the controller 2010. For example, the memory 2030 may be used for storing user data.

The electronic system 2000 may constitute a wireless communication device, or a device capable of transmitting and/or receiving information in a wireless environment. In the electronic system 2000, to transmit/receive data through a wireless communication network, the interface 2040 may be configured as a wireless interface. The interface 2040 may include an antenna and/or a wireless transceiver. In some embodiments, the electronic system 2000 may be used for a communication interface protocol of a 3rd-generation communication system, such as code division multiple access (CDMA), global system for mobile communications (GSM), north American digital cellular (NADC), extendedtime division multiple access (E-TDMA), and/or wide band code division multiple access (WCDMA). The electronic system 2000 may include at least one of the integrated circuit devices 100, 200, 300, 400, 500, 600, and 700 shown in FIGS. 1A to 9B and integrated circuit devices having various structures changed and modified therefrom without departing from the spirit and scope of the inventive concept.

While the inventive concept has been particularly shown and described with reference to embodiments thereof, it will be understood that various changes in form and details may be made therein without departing from the spirit and scope of the following claims.

What is claimed is:

1. A device comprising:
a gate line on an active region of a substrate;
a pair of source/drain regions in the active region on both sides of the gate line;
a contact plug on at least one source/drain region out of the pair of source/drain regions; and
a multilayer-structured insulating spacer between the gate line and the contact plug,
wherein the multilayer-structured insulating spacer comprises: an oxide layer; a first carbon-containing insulating layer covering a first surface of the oxide layer adjacent to the gate line; and a second carbon-containing insulating layer covering a second surface of the oxide layer, opposite to the first surface of the oxide layer, adjacent to the contact plug, and
wherein the first carbon-containing insulating layer and the second carbon-containing insulating layer have different carbon contents.

2. The device according to claim 1, further comprising: a silicon nitride layer between the first carbon-containing insulating layer and the first surface of the oxide layer.

3. The device according to claim 1, wherein the first carbon-containing insulating layer has a first carbon content, and the second carbon-containing insulating layer has a second carbon content that is greater than the first carbon content.

4. The device according to claim 1, wherein the first carbon-containing insulating layer comprises a SiOCN layer having a first carbon content, and
the second carbon-containing insulating layer comprises a SiOCN or SiCN layer having a second carbon content that is greater than the first carbon content.

5. The device according to claim 1, further comprising:
a silicon nitride layer between the second surface of oxide layer and the second carbon-containing insulating layer.

6. The device according to claim 1, further comprising:
a blocking insulating layer which covers the gate line and the insulating spacer and surrounds the contact plug.

7. The device according to claim 1, further comprising:
a gate insulating layer covering a bottom surface and a sidewall of the gate line,
wherein the first carbon-containing insulating layer contacts the gate insulating layer.

8. The device according to claim 1, wherein the second carbon-containing insulating layer contacts the contact plug.

9. The device according to claim 1, wherein the first carbon-containing insulating layer linearly extends on a sidewall of the gate line along a length direction of the gate line, and
the second carbon-containing insulating layer has a ring shape on the at least one source/drain region, the ring shape surrounding a lower portion of the contact plug.

10. The device according to claim 1, further comprising:
a silicon nitride layer between the oxide layer and the second carbon-containing insulating layer, the silicon nitride layer having a ring shape surrounding a lower portion of the contact plug.

11. The device according to claim 1, wherein the insulating spacer further comprises a silicon nitride layer between the oxide layer and the second carbon-containing insulating layer.

12. A device comprising:
a gate insulating spacer on a substrate, the gate insulating spacer comprising a first carbon-containing insulating layer;
a gate line in a space defined by the gate insulating spacer;
an oxide layer covering a sidewall of the gate line, with the gate insulating spacer being interposed between the oxide layer and the gate line;
a contact hole in one side of the gate line, the contact hole penetrating the oxide layer and exposing an active region of the substrate;
a contact insulating spacer in the contact hole, the contact insulating spacer comprising a second carbon-containing insulating layer having different carbon content from that of the first carbon-containing insulating layer; and
a contact plug in the contact hole, the contact plug being surrounded by the contact insulating spacer.

13. The device according to claim 12, wherein the contact plug contacts the second carbon-containing insulating layer.

14. The device according to claim 12, wherein the gate line contacts the first carbon-containing insulating layer.

15. The device according to claim 12, wherein the first carbon-containing insulating layer has a first carbon content, and
the second carbon-containing insulating layer has a second carbon content that is greater than the first carbon content.

16. The device according to claim 12, wherein each of the first carbon-containing insulating layer and the second carbon-containing insulating layer comprises SiCN, SiOCN, or combinations thereof.

17. A device comprising:
a gate line on an active region of a substrate;
a pair of source/drain regions in the active region on both sides of the gate line;
a contact plug on at least one source/drain region out of the pair of source/drain regions;
an oxide layer between the gate line and the contact plug;
a first carbon-containing insulating layer covering a first sidewall of the oxide layer adjacent to the gate line; and
a second carbon-containing insulating layer covering a second sidewall of the oxide layer, opposite to the first sidewall of the oxide layer, adjacent to the contact plug,
wherein the first carbon-containing insulating layer and the second carbon-containing insulating layer have different carbon contents.

18. The device according to claim 17, wherein the first carbon-containing insulating layer comprises SiOCN, and
the second carbon-containing insulating layer comprises SiCN, SiOCN, or combinations thereof.

19. The device according to claim 17, wherein the second carbon-containing insulating layer has a varying thickness extending from an upper surface of the contact plug towards the substrate such that a first sidewall of the second carbon-containing insulating layer with respect to a sidewall of the contact plug is concave and a second sidewall of the second carbon-containing insulating layer with respect to the same sidewall of the contact plug is convex.

20. The device according to claim 17, wherein the first carbon-containing insulating layer has a first atom % of carbon, and the second carbon-containing insulating layer has a second atom % of carbon different from the first atom %.

* * * * *